United States Patent
Hirayama et al.

(10) Patent No.: US 11,605,785 B2
(45) Date of Patent: Mar. 14, 2023

(54) ORGANIC ELECTROLUMINESCENCE DEVICE

(71) Applicants: HODOGAYA CHEMICAL CO., LTD., Tokyo (JP); SFC CO., LTD., Cheongju-si (KR)

(72) Inventors: Yuta Hirayama, Tokyo (JP); Takeshi Yamamoto, Tokyo (JP); Kazuyuki Suruga, Tokyo (JP); Se-Jin Lee, Cheongju-si (KR); Oun-Gyu Lee, Cheongju-si (KR); Bong-Ki Shin, Cheongju-si (KR)

(73) Assignees: HODOGAYA CHEMICAL CO., LTD., Tokyo (JP); SFC CO., LTD., Cheongju-si (KR)

( * ) Notice: Subject to any disclaimer, the term of this patent is extended or adjusted under 35 U.S.C. 154(b) by 386 days.

(21) Appl. No.: 16/650,717

(22) PCT Filed: Sep. 21, 2018

(86) PCT No.: PCT/JP2018/034990
§ 371 (c)(1),
(2) Date: Mar. 25, 2020

(87) PCT Pub. No.: WO2019/059334
PCT Pub. Date: Mar. 28, 2019

(65) Prior Publication Data
US 2020/0287141 A1    Sep. 10, 2020

(30) Foreign Application Priority Data

Sep. 25, 2017   (JP) .............................. JP2017-183655

(51) Int. Cl.
*H01L 51/00*   (2006.01)
*C09K 11/06*   (2006.01)
*H01L 51/50*   (2006.01)

(52) U.S. Cl.
CPC .......... *H01L 51/0071* (2013.01); *C09K 11/06* (2013.01); *H01L 51/006* (2013.01);
(Continued)

(58) Field of Classification Search
None
See application file for complete search history.

(56) References Cited

U.S. PATENT DOCUMENTS 5,639,914 A   6/1997   Tomiyama et al.
5,707,747 A   1/1998   Tomiyama et al.
(Continued)

FOREIGN PATENT DOCUMENTS

JP   8-48656 A   2/1996
JP   3194657 B2   7/2001
(Continued)

OTHER PUBLICATIONS

Endo et al., "Efficient up-conversion of triplet excitons into a singlet state and its application for organic light emitting diodes", Appl. Phys.Let., 2011, vol. 98, pp. 083302-1 to 083302-3.
(Continued)

*Primary Examiner* — Xiaoming Liu
(74) *Attorney, Agent, or Firm* — Birch, Stewart, Kolasch & Birch, LLP

(57) ABSTRACT

There is provided an organic electroluminescence device, including at least an anode, a hole transport layer, a light-emitting layer, an electron transport layer, and a cathode in the stated order, the organic electroluminescence device being characterized in that the hole transport layer contains an arylamine compound represented by formula (1), and the light-emitting layer contains a heterocyclic compound having a fused ring structure represented by formula (2) or a heterocyclic compound having a fused ring stricture repre-
(Continued)

sented by formula (3), wherein each of formulas (1), (2) and (3) are set forth in the specification.

6 Claims, 15 Drawing Sheets

(52) U.S. Cl.
CPC ...... *H01L 51/0067* (2013.01); *H01L 51/5024* (2013.01); *C09K 2211/185* (2013.01); *H01L 51/5056* (2013.01)

(56) References Cited

U.S. PATENT DOCUMENTS

| | | | |
|---|---|---|---|
| 5,792,557 | A | 8/1998 | Nakaya et al. |
| 7,759,030 | B2 | 7/2010 | Abe et al. |
| 7,799,492 | B2 | 9/2010 | Abe et al. |
| 8,021,764 | B2 | 9/2011 | Hwang et al. |
| 8,394,510 | B2 | 3/2013 | Mizuki et al. |
| 8,895,159 | B2 | 11/2014 | Mizuki et al. |
| 2014/0107338 | A1 | 4/2014 | Ahn et al. |
| 2016/0293850 | A1 | 10/2016 | Lee |
| 2017/0358753 | A1 | 12/2017 | Hayashi et al. |
| 2018/0331298 | A1* | 11/2018 | Hayashi ............... C07C 211/61 |
| 2018/0362843 | A1* | 12/2018 | Hayashi ............... C07D 495/14 |
| 2019/0006596 | A1 | 1/2019 | Hayashi et al. |

FOREIGN PATENT DOCUMENTS

| | | |
|---|---|---|
| JP | 2004-47442 A | 2/2004 |
| JP | 2004-253298 A | 9/2004 |
| JP | 2006-151979 A | 6/2006 |
| JP | 4943840 B2 | 5/2012 |
| JP | 2014-513064 A | 5/2014 |
| KR | 10-2013-0060157 A | 6/2013 |
| KR | 10-2015-0007476 A | 1/2015 |
| TW | 201700481 A | 1/2017 |
| TW | 201727965 A | 8/2017 |
| WO | WO 2008/062636 A1 | 5/2008 |
| WO | WO 2014/009310 A | 1/2014 |
| WO | WO 2016/111270 A1 | 7/2016 |
| WO | WO 2017/073594 A1 | 5/2017 |
| WO | WO-2017073594 A1 * | 5/2017 ........... C07C 211/54 |
| WO | WO-2017099155 A1 * | 6/2017 ........... C07C 211/54 |
| WO | WO 2017/122813 A1 | 7/2017 |

OTHER PUBLICATIONS

International Search Report, issued in PCT/JP2018/034990, dated Dec. 25, 2018.

Japan OLED Forum, proceedings of the third meeting, 2006, pp. 13-14.

The Japan Society of Applied Physics, proceedings of the ninth workshop, 2001, pp. 23-31.

The Japan Society of Applied Physics, proceedings of the ninth workshop, 2001, pp. 55-61.

Extended European Search Report for European Application No. 18859295.0, dated Jun. 4, 2021.

Taiwanese Office Action and Search Report for Taiwanese Application No. 107133617, dated Jan. 18, 2022, with English translation.

Chinese Office Action and Search Report for Chinese Application No. 201880061993.X, dated Aug. 1, 2022, with an English translation.

Japanese Office Action for Japanese Application No. 2019-543724, dated Jul. 12, 2022 with English translation.

\* cited by examiner 2-1

2-2

2-3

2-4

2-5

2-6

2-7

2-8

2-9

2-10

2-11

2-12

2-13

2-14

2-15

ORGANIC ELECTROLUMINESCENCE DEVICE

TECHNICAL FIELD

The present invention relates to an organic electroluminescence device that is a self-light-emitting device suitable for various display devices, and specifically to an organic electroluminescence device (hereinafter, referred to as organic EL device in some cases) that uses a specific arylamine compound and a specific compound having a benzoazole ring structure.

BACKGROUND ART

Since the organic EL device is a self-light-emitting device, it is brighter than the liquid crystal device and excellent in visibility, and capable of performing clear display, and thus, active research has been done thereon.

In 1987, C. W. Tang et al. (Eastman Kodak Company) have developed a stacked structural device in which various roles are assigned to the materials, and put an organic EL device using an organic material to practical use. They have stacked a phosphor capable of transporting electrons and an organic material capable of transporting holes, and injected both charges into a phosphor layer to emit light, thereby achieving high luminance of 1000 cd/m$^2$ or more with a voltage of 10 V or less (see, for example, Patent Literature 1 and Patent Literature 2).

Many improvements have been made for practical use of the organic EL device until now. In an electroluminescence device that subdivides the various roles in the stacked structure and includes an anode, a hole injection layer, a hole transport layer, a light-emitting layer, an electron transport layer, an electron injection layer, and a cathode in the stated order on a substrate, high efficiency and durability have been achieved (see, for example, Non-Patent Literature 1).

Further, for the purpose of further improving the light emission efficiency, attempts have been made to use a triplet exciton and utilization of a phosphorescent compound is being considered (see, for example, Non-Patent Literature 2).

Then, a device using light emission by thermally activated delayed fluorescence (TADF) has also been developed. In 2011, Adachi et al. (Kyushu University) have realized the external quantum efficiency of 5.3% by a device using a thermally activated delayed fluorescence material. (see, for example, Non-Patent Literature 3).

The light-emitting layer can also be prepared by doping a charge transport compound generally called a host material with a fluorescent compound, a phosphorescent compound, or a material emitting delayed fluorescence. As described in the above-mentioned Non-Patent Literature, selection of an organic material in the organic EL device significantly affects various properties such as efficiency and durability of the device (see, for example, Non-Patent Literature 2).

In the organic EL device, charges injected from both electrodes are recombined in the light-emitting layer to obtain light emission. In order to obtain high light emission efficiency, it is important how to efficiently transfer both charges of holes and electrons to the light-emitting layer, balance both charges to be injected into the light-emitting layer, and confine the generated excitons, for example. Enhancing the hole injection property from the hole transport layer to the light-emitting layer and enhancing the electron blocking property of the hole transport layer that prevents electrons from leaking from the light-emitting layer to the hole transport layer improve the probability of recombination of holes and electrons in the light-emitting layer, which makes it possible to efficiently generate excitons. Further, high light emission efficiency can be achieved by confining, in the light-emitting layer, the excitons generated in the light-emitting layer, without leaking them to the transport layer. Therefore, the role played by the hole transport material is important, and a hole transport material having a high hole injection property, a high mobility of holes, a high electron blocking property, and a high durability to electrons is desired.

Further, from the viewpoint of device lifetime, the heat resistance and amorphous property of the material are also important. In the case of a material having a low heat resistance, thermal decomposition occurs even at a low temperature due to heat generated at the time of driving the device, and the material is degraded. In the case of a material having a low amorphous property, crystallization of the thin film occurs even in a short time, and the device is degraded. Therefore, the material to be used is desired to have a high heat resistance and an excellent amorphous property.

N, N'-diphenyl-N, N'-di (α-naphthyl) benzidine (NPD) and various aromatic amine derivatives have been known as hole transport materials that have been used for an organic EL device (see, for example, Patent Literature 1 and Patent Literature 2). Although NPD has favorable hole transport performance, it has a glass transition point (Tg) as low as 96° C. as an index of heat resistance, and the device characteristics are degraded due to crystallization under high-temperature conditions (see, for example, Non-Patent Literature 4). Further, among the aromatic amine derivatives described in the above-mentioned Patent Literatures, compounds having excellent mobility of holes, i.e., 10$^{-3}$ cm$^2$/Vs or more, have been known (see, for example, Patent Literature 1 and Patent Literature 2). However, since these compounds have an insufficient electron blocking property, some of electrons pass through the light-emitting layer and improvement in light emission efficiency cannot be expected. In this regard, for further higher efficiency, a material that has a higher electron blocking properties and higher heat resistance, and is stable in a thin film state has been demanded. Further, although an aromatic amine derivative having high durability (see, for example, Patent Literature 3) has been reported, it is used as a charge transport material to be used for an electrophotographic photoreceptor, and there has been no example of using it for an organic EL device.

As compounds having improved properties such as the heat resistance and the hole injection property, an arylamine compound having a substituted carbazole structure have been proposed (see, for example, Patent Literature 4 and Patent Literature 5). However, in the device using these compounds for the hole injection layer or the hole transport layer, although the heat resistance or the light emission efficiency has been improved, it is still not sufficient and a further lower driving voltage and further higher light emission efficiency are desired.

In order to improve the device characteristics of the organic EL device and improve the yield of device preparation, a device that has high light emission efficiency, a low driving voltage, and a long lifetime, in which holes and electrons can be recombined with high efficiency, has been demanded, the device being achieved by combining materials excellent in hole/electron injection/transport performance, stability in a thin film state, and durability, Further, in order to improve the device characteristics of the organic EL device, a carrier-balanced device with high efficiency, a low driving voltage, and a long lifetime, which is achieved by combining materials excellent in hole/electron injection/transport performance, stability in a thin film state, and durability, has been demanded.

CITATION LIST

Patent Literature

Patent Literature 1: Japanese Patent Application Laid-open No. 1996-048656
Patent Literature 2: Japanese Patent No. 3194657
Patent Literature 3: Japanese Patent No. 4943840
Patent Literature 4: Japanese Patent Application Laid-open No. 2006-151979
Patent Literature 5: WO 2008/062636
Patent Literature 6: WO 2014/009310
Patent Literature 7: Japanese Unexamined Patent Application Publication No. 2014-513064
Patent Literature 8: Korean Published Unexamined Patent Application 10-2013-0060157

Non-Patent Literature

Non-Patent Literature 1: The Japan Society of Applied Physics, proceedings of the ninth workshop, pp. 55-61 (2001)
Non-Patent Literature 2: The Japan Society of Applied Physics, proceedings of the ninth workshop, pp. 23-31 (2001)
Non-Patent Literature 3: Appl. Phys. Let., 98, 083302(2011)
Non-Patent Literature 4: Japan OLED Forum, proceedings of the third meeting, pp. 13-14 (2006)

DISCLOSURE OF INVENTION

Technical Problem

It is an object of the present invention to provide an organic EL device having (1) light emission efficiency and power efficiency, (2) a low light emission start voltage, (3) a low practical driving voltage, and particularly (4) a long lifetime by combining various materials for an organic EL device that is excellent in hole/electron injection/transport performance, electron blocking performance, stability in a thin film state, and durability as materials for an organic EL device that has high light emission efficiency and high durability so that properties of each of the materials can be effectively expressed.

Examples of the physical properties that an organic EL device to be provided by the present invention should have include (1) having high light emission efficiency and high power efficiency, (2) having a low light emission start voltage, (3) having a low practical driving voltage, and particularly (4) having a long lifetime.

Solution to Problem

In view of the above, in order to achieve the above-mentioned object, the present inventors have focused on that an arylamine-based material has excellent hole injection/transport performance and durability, and is stable in a thin film state and that the light emission efficiency of a heterocyclic compound having a fused ring structure is excellent. Various organic EL devices in which a specific arylamine compound and a heterocyclic compound having a fused ring structure with a specific structure were selected to make it possible to inject/transport holes to the light-emitting layer, and a hole transport material and a light-emitting layer material were combined to achieve a carrier balance that matches the properties of the material of the light-emitting layer were prepared, and the properties of the device were intensively evaluated. Further, the present inventors have focused on that a heterocyclic compound having a pyrimidine ring structure is excellent in electron injection/transporting performance and durability and is stable in a thin film state. Various organic EL devices in which a specific compound having a pyrimidine ring structure was selected to enhance the electron injection/transporting efficiency to the light-emitting layer, and a hole transport material, a light-emitting layer material, and an electron transport material are combined so that the carrier balance matches the properties of the material of the light-emitting layer better were prepared, and the properties of the device were intensively evaluated. As a result, the present invention was completed.

That is, in accordance with the present invention, the following organic EL device is provided.

[1] An organic electroluminescence device, including at least an anode, a hole transport layer, a light-emitting layer, an electron transport layer, and a cathode in the stated order, the organic electroluminescence device being characterized in that the hole transport layer contains an arylamine compound represented by the following general formula (1), and the light-emitting layer contains a heterocyclic compound having a fused ring structure represented by the following general formula (2) or a heterocyclic compound having a fused ring structure represented by the following general formula (3).

(Chem. 1)

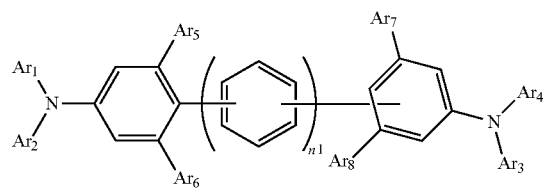

(1)

(In the formula, $Ar_1$ to $Ar_5$ may be the same or different from each other, and represents a substituted or unsubstituted aromatic hydrocarbon group, a substituted or unsubstituted aromatic heterocyclic group, or a substituted or unsubstituted fused polycyclic aromatic group. $Ar_6$ to $Ar_8$ may be the same or different from each other, and represents a hydrogen atom, a substituted or unsubstituted aromatic hydrocarbon group, a substituted or unsubstituted aromatic heterocyclic group, or a substituted or unsubstituted fused polycyclic aromatic group. n1 represents 0, 1, or 2. Here, $Ar_3$ and $Ar_4$ may form a ring with a single bond or may be bonded to each other via a substituted or unsubstituted methylene group, an oxygen atom, or a sulfur atom to form a ring. $Ar_3$ or $Ar_4$ may form a ring with a benzene ring to which an $Ar_3Ar_4$—N group is bonded, with a single bond or may be bonded to each other via a substituted or unsubstituted methylene group, an oxygen atom, or a sulfur atom to form a ring.)

(Chem. 2)

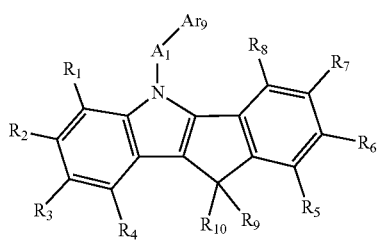

(2)

(In the formula, A₁ represents a substituted or unsubstituted aromatic hydrocarbon divalent group, a substituted or unsubstituted aromatic heterocyclic divalent group, a substituted or unsubstituted fused polycyclic aromatic divalent group, or a single bond. Ar₉ represents a substituted or unsubstituted aromatic hydrocarbon group, a substituted or unsubstituted aromatic heterocyclic group, or a substituted or unsubstituted fused polycyclic aromatic group. R₁ to R₄ may be the same or different from each other, and represents a hydrogen atom, a deuterium atom, a fluorine atom, a chlorine atom, a cyano group, a nitro group, a linear or branched alkyl group having 1 to 6 carbon atoms which may have a substituted group, cycloalkyl group having 5 to 10 atoms which may have a substituted group, a linear or branched alkenyl group having 2 to 6 atoms which may have a substituted group, a linear or branched alkyloxy group having 1 to 6 carbon atoms which may have a substituted group, a cycloalkyloxy group having 5 to 10 carbon atoms which may have a substituted group, a substituted or unsubstituted aromatic hydrocarbon group, a substituted or unsubstituted aromatic heterocyclic group, a substituted or unsubstituted fused polycyclic aromatic group, a substituted or unsubstituted aryloxy group, or a disubstituted amino group substituted with a group selected from the group consisting of an aromatic hydrocarbon group, an aromatic heterocyclic group, and a fused polycyclic aromatic group. The groups of R₁ to R₄ may form a ring with a single bond or may be bonded to each other via a substituted or unsubstituted methylene group, an oxygen atom, or a sulfur atom to form a ring. R₁ to R₄ and a benzene ring to which R₁ to R₄ are bonded, may be bonded to each other via a linking group such as a substituted or unsubstituted methylene group, an oxygen atom, a sulfur atom, and a monoarylamino group to form a ring. R₅ to R₈ may be the same or different from each other, and represents a hydrogen atom, a deuterium atom, a fluorine atom, a chlorine atom, a cyano group, a nitro group, a linear or branched alkyl group having 1 to 6 carbon atoms which may have a substituted group, a cycloalkyl group having 5 to 10 atoms which may have a substituted group, a linear or branched alkenyl group having 2 to 6 atoms which may have a substituted group, a linear or branched alkyloxy group having 1 to 6 carbon atoms which may have a substituted group, a cycloalkyloxy group having 5 to 10 carbon atoms which may have a substituted group, a substituted or unsubstituted aromatic hydrocarbon group, a substituted or unsubstituted aromatic heterocyclic group, a substituted or unsubstituted fused polycyclic aromatic group, a substituted or unsubstituted aryloxy group, or a disubstituted amino group substituted with a group selected from the group consisting of an aromatic hydrocarbon group, an aromatic heterocyclic group, and a fused polycyclic aromatic group. The groups of R₅ to R₈ may form a ring with a single bond or may be bonded to each other via a substituted or unsubstituted methylene group, an oxygen atom, or a sulfur atom to form a ring. R₅ to R₈ and a benzene ring to which R₅ to R₈ are bonded, may be bonded to each other via a linking group such as a substituted or unsubstituted methylene group, an oxygen atom, a sulfur atom, and a monoarylamino group to form a ring. R₉ and R₁₀ may be the same or different from each other, and represents a linear or branched alkyl group having 1 to 6 carbon atoms which may have a substituted group, a substituted or unsubstituted aromatic hydrocarbon group, a substituted or unsubstituted aromatic heterocyclic group, or a substituted or unsubstituted fused polycyclic aromatic group. The groups of R₉ and R₁₀ may form a ring with a single bond or may be bonded to each other via a substituted or unsubstituted methylene group, an oxygen atom, or a sulfur atom to form a ring.)

(Chem. 3)

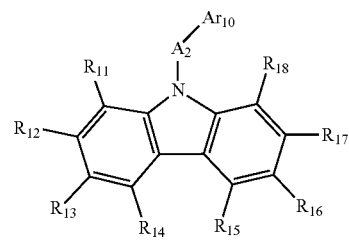

(3)

(In the formula, A₂ represents a substituted or unsubstituted aromatic hydrocarbon divalent group, a substituted or unsubstituted aromatic heterocyclic divalent group, a substituted or unsubstituted fused polycyclic aromatic divalent group, or a single bond. Ar₁₀ represents a substituted or unsubstituted aromatic hydrocarbon group, a substituted or unsubstituted aromatic heterocyclic group, or a substituted or unsubstituted fused polycyclic aromatic group. R₁₁ to R₁₄ may be the same or different from each other, and represents a hydrogen atom, a deuterium atom, a fluorine atom, a chlorine atom, a cyano group, a nitro group, a linear or branched alkyl group having 1 to 6 carbon atoms which may have a substituted group, a cycloalkyl group having 5 to 10 atoms which may have a substituted group, a linear or branched alkenyl group having 2 to 6 atoms which may have a substituted group, a linear or branched alkyloxy group having 1 to 6 carbon atoms which may have a substituted group, a cycloalkyloxy group having 5 to 10 carbon atoms which may have a substituted group, a substituted or unsubstituted aromatic hydrocarbon group, a substituted or unsubstituted aromatic heterocyclic group, a substituted or unsubstituted fused polycyclic aromatic group, a substituted or unsubstituted aryloxy group, or a disubstituted amino group substituted with a group selected from the group consisting of an aromatic hydrocarbon group, an aromatic heterocyclic group, and a fused polycyclic aromatic group. The groups of R₁₁ to R₁₄ may form a ring with a single bond or may be bonded to each other via a substituted or unsubstituted methylene group, an oxygen atom, or a sulfur atom to form a ring. R₁₁ to R₁₄ and a benzene ring to which R₁₁ to R₁₄ are bonded, may be bonded to each other via a linking group such as a substituted or unsubstituted methylene group, an oxygen atom, a sulfur atom, and a monoarylamino group to form a ring. R₁₅ to R₁₈ may be the same or different from each other, and represents a hydrogen atom, a deuterium atom, a fluorine atom, a chlorine atom, a cyano group, a nitro group, a linear or branched alkyl group having 1 to 6 carbon atoms which may have a substituted group, a cycloalkyl group having 5 to 10 atoms which may have a substituted group, a linear or branched alkenyl group having 2 to 6 atoms which may have a substituted group, a linear or branched alkyloxy group having 1 to 6 carbon atoms which may have a substituted group, a cycloalkyloxy group having 5 to 10 carbon atoms which may have a substituted group, a substituted or unsubstituted aromatic hydrocarbon group, a substituted or unsubstituted aromatic heterocyclic group, a substituted or unsubstituted fused polycyclic aromatic group, a substituted or unsubstituted aryloxy group, or a disubstituted amino group substituted with a group selected from the group consisting of an aromatic hydrocarbon group, an aromatic heterocyclic group, and a fused polycyclic aromatic group. The groups of $R_{15}$ to $R_{18}$ may form a ring with a single bond or may be bonded to each other via a substituted or unsubstituted methylene group, an oxygen atom, or a sulfur atom to form a ring. $R_{15}$ to $R_{18}$ and a benzene ring to which $R_{15}$ to $R_{18}$ are bonded, may be bonded to each other via a linking group such as a substituted or unsubstituted methylene group, an oxygen atom, a sulfur atom, and a monoarylamino group to form a ring.)

[2] The organic EL device according to [1] above, characterized in that the arylamine compound is represented by the following general formula (1a).

(Chem. 4)

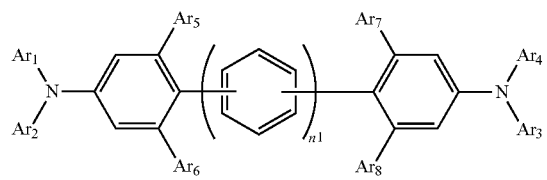

(1a)

(In the formula, $Ar_1$ to $Ar_5$ may be the same or different from each other, and represents a substituted or unsubstituted aromatic hydrocarbon group, a substituted or unsubstituted aromatic heterocyclic group, or a substituted or unsubstituted fused polycyclic aromatic group. $Ar_6$ to $Ar_8$ may be the same or different from each other, and represents a hydrogen atom, a substituted or unsubstituted aromatic hydrocarbon group, a substituted or unsubstituted aromatic heterocyclic group, or a substituted or unsubstituted fused polycyclic aromatic group. n1 represents 0, 1, or 2. Here, $Ar_3$ and $Ar_4$ may form a ring with a single bond or may be bonded to each other via a substituted or unsubstituted methylene group, an oxygen atom, or a sulfur atom to form a ring. $Ar_3$ or $Ar_4$ may form a ring with a benzene ring to which an $Ar_3Ar_4$—N group is bonded, with a single bond or may be bonded to each other via a substituted or unsubstituted methylene group, an oxygen atom, or a sulfur atom to form a ring.)

[3] The organic electroluminescence device according to [1] or [2] above, characterized in that the hole transport layer has a two-layer structure of a first hole transport layer and a second hole transport layer, and the first hole transport layer contains an arylamine compound represented by the general formula (1).

[4] The organic electroluminescence device according to [1] or [2] above, characterized in that
the hole transport layer has a two-layer structure of a first hole transport layer and a second hole transport layer, and at least one of the second hole transport layer and a stacked layer disposed between the first hole transport layer and the light-emitting layer contains an arylamine compound represented by the general formula (1).

[5] The organic electroluminescence device according to any one of [1] to [4] above, characterized in that the electron transport layer contains a compound having a pyrimidine ring structure represented by the following general formula (4).

(Chem. 5)

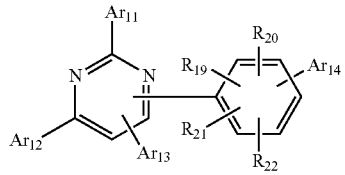

(4)

(In the formula, $Ar_{11}$ represents a substituted or unsubstituted aromatic hydrocarbon group or a substituted or unsubstituted fused polycyclic aromatic group. $Ar_{12}$ and $Ar_{13}$ may be the same or different from each other, and each represent a hydrogen atom, a substituted or unsubstituted aromatic hydrocarbon group, or a substituted or unsubstituted fused polycyclic aromatic group. $Ar_{14}$ represents a substituted or unsubstituted aromatic heterocyclic group. $R_{19}$ to $R_{22}$ may be the same or different from each other, and each represent a hydrogen atom, a deuterium atom, a fluorine atom, a chlorine atom, a cyano group, a trifluoromethyl group, a linear or branched alkyl group having 1 to 6 carbon atoms, a substituted or unsubstituted aromatic hydrocarbon group, a substituted or unsubstituted aromatic heterocyclic group, or a substituted or unsubstituted fused polycyclic aromatic group. Here, there is no case that both $Ar_{12}$ and $Ar_{13}$ are hydrogen atoms.)

[6] The organic electroluminescence device according to any one of [1] to [5] above, characterized in that the light-emitting layer contains a red light-emitting material.

[7] The organic electroluminescence device according to any one of [1] to [5] above, characterized in that the light-emitting layer contains a phosphorescent light-emitting material.

[8] The organic electroluminescence device according to [6] or [7] above, characterized in that the phosphorescent light-emitting material is a metal complex containing iridium or platinum.

Advantageous Effects of Invention

The organic EL device according to the present invention has selected a specific arylamine compound capable of effectively expressing the role of injecting/transporting holes and has selected a specific heterocyclic compound having a fused ring structure, making it possible to efficiently inject/transport holes to the light-emitting layer and realize an organic EL device that has high light emission efficiency, a low driving voltage, and a long lifetime. Further, with the combination with a specific electro transport material to achieve the carrier balance that matches the properties of the specific heterocyclic compound having a fused ring structure, an organic EL device that has high efficiency, a low driving voltage, and particularly a long lifetime can be realized. Further, in the case where the hole transport layer has a two-layer structure of a first hole transport layer and a second hole transport layer, it is possible to realize an organic EL device having a further longer lifetime by combining two types of arylamine compounds having a specific structure while considering the carrier balance and the properties of the materials.

In accordance with the present invention, it is possible to improve the light emission efficiency, driving voltage, and durability of the existing organic EL device.

MODE(S) FOR CARRYING OUT THE INVENTION

Figure 1:
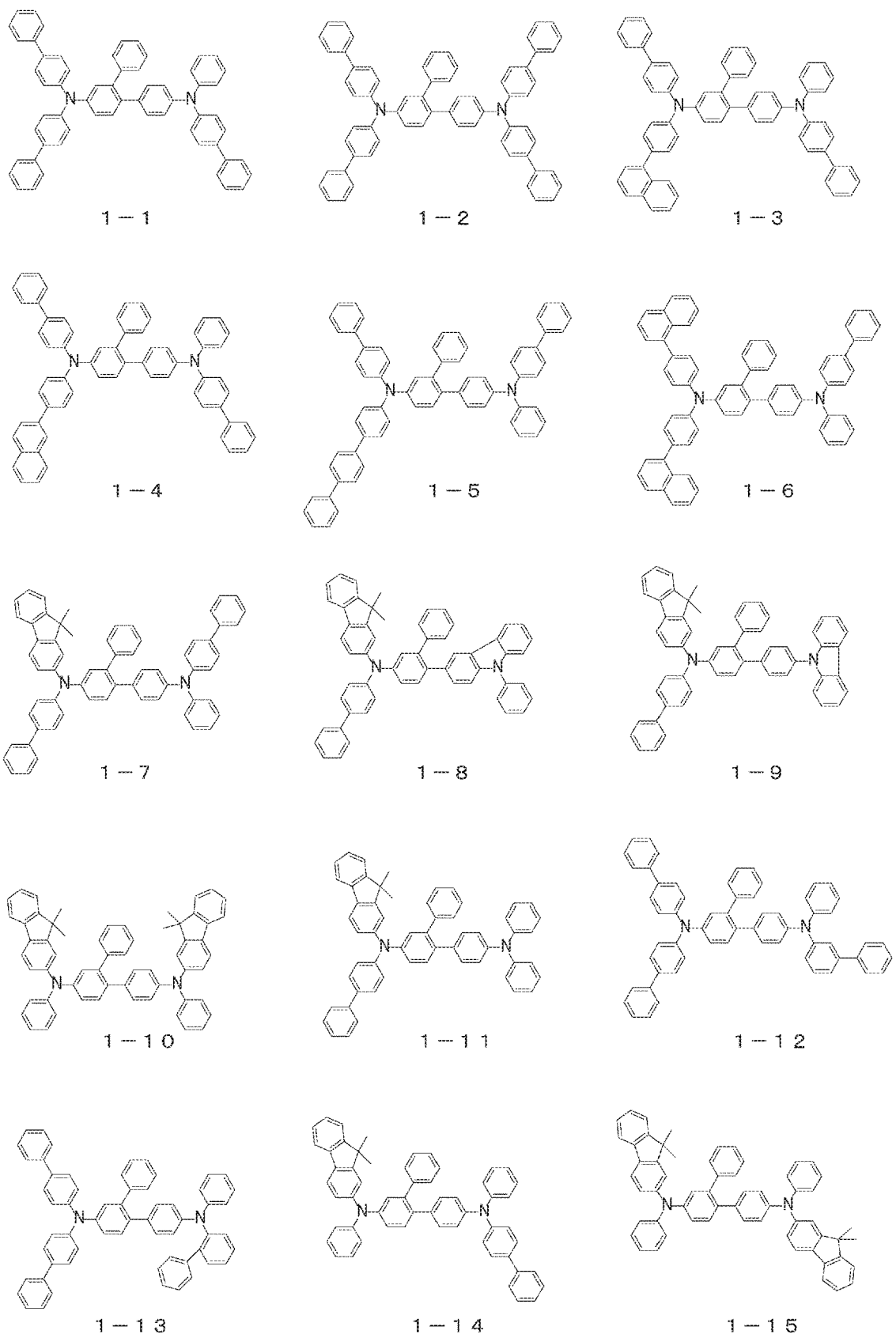
FIG. 1 is a diagram showing Compound 1-1 to Compound 1-15 that are arylamine compounds represented by the general formula (1) of the present invention.

Specific examples of the "aromatic hydrocarbon group", "aromatic heterocyclic group", or "fused polycyclic aromatic group" in the "substituted or unsubstituted aromatic hydrocarbon group", "substituted or unsubstituted aromatic heterocyclic group", or "substituted or unsubstituted fused polycyclic aromatic group" represented by $Ar_1$ to $Ar_8$ in the general formulae (1) and (1a) include a phenyl group, a biphenylyl group, a terphenylyl group, a naphthyl group, an anthracenyl group, a phenanthrenyl group, a fluorenyl group, an indenyl group, a pyrenyl group, a perylenyl group, a fluoranthenyl group, a triphenylenyl group, a pyridyl group, a pyrimidinyl group, a triazinyl group, a furil group, a pyrrolyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, an acridinyl group, and a carbolinyl group.

Here, $Ar_3$ and $Ar_4$ may form a ring with a single bond or may be bonded to each other via a substituted or unsubstituted methylene group, an oxygen atom, or a sulfur atom to form a ring. $Ar_3$ or $Ar_4$ may form a ring with a benzene ring to which an $Ar_3Ar_4$—N group is bonded, with a single bond or may be bonded to each other via a substituted or unsubstituted methylene group, an oxygen atom, or a sulfur atom to form a ring.

Specific examples of the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a) include a deuterium atom, a cyano group, a nitro group; a halogen atom such as a fluorine atom, a chlorine atom, a bromine atom, and an iodine atom; a linear or branched alkyl group having 1 to 6 carbon atoms such as a methyl group, an ethyl group, an n-propyl group, an isopropyl group, an n-butyl group, an isobutyl group, a tert-butyl group, an n-pentyl group, an isopentyl group, a neopentyl group, and an n-hexyl group; a linear or branched alkyloxy group having 1 to 6 carbon atoms such as a methyloxy group, an ethyloxy group, and a propyloxy group; an alkenyl group such as a vinyl group, an allyl group; an aryloxy group such as a phenyloxy group and a tolyloxy group; an arylalkyloxy group such as a benzyloxy group and a phenethyloxy group; an aromatic hydrocarbon group or fused polycyclic aromatic group such as a phenyl group, a biphenylyl group, a terphenylyl group, a naphthyl group, an anthracenyl group, a phenanthrenyl group, a fluorenyl group, an indenyl group, a pyrenyl group, a perylenyl group, a fluoranthenyl group, and a triphenylenyl group; an aromatic heterocyclic group such as a pyridyl group, a pyrimidinyl group, a triazinyl group, a thienyl group, a furil group, a pyrrolyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, and a carbolinyl group; an arylvinyl group such as a styryl group and a naphthylvinyl group; an acyl group such as an acetyl group and a benzoyl group, and these substituted groups may be further substituted with the exemplified substituted groups. Further, these substituted groups may form a ring with a single bond, or may be bonded to each other via a substituted or unsubstituted methylene group, an oxygen atom, or a sulfur atom to form a ring.

Specific examples of the "aromatic hydrocarbon", "aromatic heterocycle", or "fused polycyclic aromatic" of the "substituted or unsubstituted aromatic hydrocarbon", "substituted or unsubstituted aromatic heterocycle", or "substituted or unsubstituted fused polycyclic aromatic" in the "substituted or unsubstituted aromatic hydrocarbon divalent group", "substituted or unsubstituted aromatic heterocyclic divalent group", or "substituted or unsubstituted fused polycyclic aromatic divalent group" represented by $A_1$ in the general formula (2) include benzene, biphenyl, terphenyl, tetrakisphenyl, styrene, naphthalene, anthracene, acenaphthalene, fluorene, phenanthrene, indan, pyrene, triphenylene, pyridine, pyrimidine, triazine, pyrrole, furan, thiophene, quinoline, isoquinoline, benzofuran, benzothiophene, indoline, carbazole, carboline, benzoxazole, benzothiazole, quinoxaline, benzimidazole, pyrazole, dibenzofuran, dibenzothiophene, naphthyridine, phenanthroline, and acridine.

Then, the "substituted or unsubstituted aromatic hydrocarbon divalent group", "substituted or unsubstituted aromatic heterocyclic divalent group", or "substituted or unsubstituted fused polycyclic aromatic divalent group" represented by $A_1$ in the general formula (2) represents a divalent group formed by removing two hydrogen atoms from the "aromatic hydrocarbon", "aromatic heterocycle", or "fused polycyclic aromatic".

Further, these divalent groups may have a substituted group. Examples of the substituted group include the similar ones as described for the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a), and aspects similar to those of the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a) can be taken.

Examples of the "aromatic hydrocarbon group", "aromatic heterocyclic group", or "fused polycyclic aromatic group" in the "substituted or unsubstituted aromatic hydrocarbon group", "substituted or unsubstituted aromatic heterocyclic group", or "substituted or unsubstituted fused polycyclic aromatic group" represented by Arg in the general formula (2) include the similar ones as described for the "aromatic hydrocarbon group", "aromatic heterocyclic group", or "fused polycyclic aromatic group" in the "substituted or unsubstituted aromatic hydrocarbon group", "substituted or unsubstituted aromatic heterocyclic group", or "substituted or unsubstituted fused polycyclic aromatic group" represented by $Ar_1$ to $Ar_8$ in the general formula (1).

Further, these divalent groups may have a substituted group. Examples of the substituted group include the similar ones as described for the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a), and aspects similar to those of the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a) can be taken.

Specific examples of the "linear or branched alkyl group having 1 to 6 carbon atoms", "cycloalkyl group having 5 to 10 atoms", or "linear or branched alkenyl group having 2 to 6 atoms" in the "linear or branched alkyl group having 1 to 6 carbon atoms which may have a substituted group", "cycloalkyl group having 5 to 10 atoms which may have a substituted group", or "linear or branched alkenyl group having 2 to 6 atoms which may have a substituted group" represented by $R_1$ to $R_8$ in the general formula (2) include a methyl group, an ethyl group, an n-propyl group, an isopropyl group, an n-butyl group, an isobutyl group, a tert-butyl group, an n-pentyl group, an isopentyl group, a neopentyl group, an n-hexyl group, a cyclopentyl group, a cyclohexyl group, a 1-adamantyl group, a 2-adamantyl group, a vinyl group, an allyl group, an isopropenyl group, and a 2-butheneyl group. These groups may form a ring with a single bond or may be bonded to each other via a substituted or unsubstituted methylene group, an oxygen atom, or a sulfur atom to form a ring. These groups ($R_1$ to $R_8$) and a benzene ring to which these groups ($R_1$ to $R_8$) are directly bonded, may be bonded to each other via a linking group such as a substituted or unsubstituted methylene group, an oxygen atom, a sulfur atom, and a monoarylamino group to form a ring.

Specific examples of the "substituted group" in the "linear or branched alkyl group having 1 to 6 carbon atoms which has a substituted group", "cycloalkyl group having 5 to 10 atoms which has a substituted group", or "linear or branched alkenyl group having 2 to 6 atoms which has a substituted group" represented by $R_1$ to $R_8$ in the general formula (2) include a deuterium atom, a cyano group, a nitro group; a halogen atom such as a fluorine atom, a chlorine atom, a bromine atom, and an iodine atom; a linear or branched alkyloxy group having 1 to 6 carbon atoms such as a methyloxy group, an ethyloxy group, and a propyloxy group; an alkenyl group such as a vinyl group and an allyl group; an aryloxy group such as a phenyloxy group and a tolyloxy group; an arylalkyloxy group such as a benzyloxy group and a phenethyloxy group; an aromatic hydrocarbon group or fused polycyclic aromatic group such as a phenyl group, a biphenylyl group, a terphenylyl group, a naphthyl group, an anthracenyl group, a phenanthrenyl group, a fluorenyl group, an indenyl group, a pyrenyl group, a perylenyl group, a fluoranthenyl group, and a triphenylenyl group; an aromatic heterocyclic group such as a pyridyl group, a pyrimidinyl group, a triazinyl group, a thienyl group, a furil group, a pyrrolyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, and a carbolinyl group; a disubstituted amino group substituted with an aromatic hydrocarbon group or fused polycyclic aromatic group, such as a diphenylamino group and a dinaphthylamino group; a disubstituted amino group substituted with an aromatic heterocyclic group, such as a dipyridylamino group and a dithienylamino group; and a disubstituted amino group substituted with a substituted group selected from the group consisting of an aromatic hydrocarbon group, a fused polycyclic aromatic group, and an aromatic heterocyclic group, and these substituted groups may be further substituted with the exemplified substituted groups. Further, these substituted groups may form a ring with a single bond, or may be bonded to each other via a substituted or unsubstituted methylene group, an oxygen atom, or a sulfur atom to form a ring.

Specific examples of the "linear or branched alkyloxy group having 1 to 6 carbon atoms", or "cycloalkyloxy group having 5 to 10 carbon atoms" in the "linear or branched alkyloxy group having 1 to 6 carbon atoms which may have a substituted group" or "cycloalkyloxy group having 5 to 10 carbon atoms which may have a substituted group" represented by $R_1$ to $R_8$ in the general formula (2) include a methyloxy group, an ethyloxy group, an n-propyloxy group, an isopropyloxy group, an n-butyloxy group, a tert-butyloxy group, an n-pentyloxy group, an n-hexyloxy group, a cyclopentyloxy group, a cyclohexyloxy group, a cycloheptyloxy group, a cyclooctyloxy group, a 1-adamantyloxy group, and a 2-adamantyloxy group. These groups may form a ring with a single bond or may be bonded to each other via a substituted or unsubstituted methylene group, an oxygen atom, or a sulfur atom to form a ring. These groups ($R_1$ to $R_8$) and a benzene ring to which these groups ($R_1$ to $R_8$) are directly bonded, may be bonded to each other via a linking group such as a substituted or unsubstituted methylene group, an oxygen atom, a sulfur atom, and a monoarylamino group to form a ring.

Further, these divalent groups may have a substituted group. Examples of the substituted group include the similar ones as described for the "substituted group" in the "linear or branched alkyl group having 1 to 6 carbon atoms which has a substituted group", "cycloalkyl group having 5 to 10 atoms which has a substituted group", or "linear or branched alkenyl group having 2 to 6 atoms which has a substituted group" represented by $R_1$ to $R_8$ in the general formula (2), and aspects similar to those of the "substituted group" in the "linear or branched alkyl group having 1 to 6 carbon atoms which has a substituted group", "cycloalkyl group having 5 to 10 atoms which has a substituted group", or "linear or branched alkenyl group having 2 to 6 atoms which has a substituted group" represented by $R_1$ to $R_8$ in the general formula (2) can be taken.

Examples of the "aromatic hydrocarbon group", "aromatic heterocyclic group", or "fused polycyclic aromatic group" in the "substituted or unsubstituted aromatic hydrocarbon group", "substituted or unsubstituted aromatic heterocyclic group", or "substituted or unsubstituted fused polycyclic aromatic group" represented by $R_1$ to $R_8$ in the general formula (2) include the similar ones as described for the "aromatic hydrocarbon group", "aromatic heterocyclic group", or "fused polycyclic aromatic group" in the "substituted or unsubstituted aromatic hydrocarbon group", "substituted or unsubstituted aromatic heterocyclic group", or "substituted or unsubstituted fused polycyclic aromatic group" represented by $Ar_1$ to $Ar_8$ in the general formulae (1) and (1a). These groups may form a ring with a single bond or may be bonded to each other via a substituted or unsubstituted methylene group, an oxygen atom, or a sulfur atom to form a ring. These groups ($R_1$ to $R_8$) and a benzene ring to which these groups ($R_1$ to $R_8$) are directly bonded, may be bonded to each other via a linking group such as a substituted or unsubstituted methylene group, an oxygen atom, a sulfur atom, and a monoarylamino group to form a ring.

Further, these divalent groups may have a substituted group. Examples of the substituted group include the similar ones as described for the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a), and aspects similar to those of the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a) can be taken.

Specific examples of the "aryloxy group" in the "substituted or unsubstituted aryloxy group" represented by $R_1$ to $R_8$ in the general formula (2) include a phenyloxy group, a biphenylyloxy group, a terphenylyloxy group, a naphthyloxy group, an anthracenyloxy group, a phenanthrenyloxy group, a fluorenyloxy group, an indenyloxy group, a pyrenyloxy group, and a perylenyloxy group. These groups may form a ring with a single bond or may be bonded to each other via a substituted or unsubstituted methylene group, an oxygen atom, or a sulfur atom to form a ring. These groups ($R_1$ to $R_8$) and a benzene ring to which these groups ($R_1$ to $R_8$) are directly bonded, may be bonded to each other via a linking group such as a substituted or unsubstituted methylene group, an oxygen atom, a sulfur atom, and a monoarylamino group to form a ring.

Further, these divalent groups may have a substituted group. Examples of the substituted group include the similar ones as described for the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a), and aspects similar to those of the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a) can be taken.

Examples of the "aromatic hydrocarbon group", "aromatic heterocyclic group", or "fused polycyclic aromatic group" in the "disubstituted amino group substituted with a group selected from the group consisting of an aromatic hydrocarbon group, an aromatic heterocyclic group, and a fused polycyclic aromatic group" represented by $R_1$ to $R_8$ in the general formula (2) include the similar ones as described for the "aromatic hydrocarbon group", "aromatic heterocyclic group", or "fused polycyclic aromatic group" in the "substituted or unsubstituted aromatic hydrocarbon group", "substituted or unsubstituted aromatic heterocyclic group", or "substituted or unsubstituted fused polycyclic aromatic group" represented by $Ar_1$ to $Ar_8$ in the general formulae (1) and (1a).

Further, these divalent groups may have a substituted group. Examples of the substituted group include the similar ones as described for the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a), and aspects similar to those of the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a) can be taken.

In the "disubstituted amino group substituted with a group selected from the group consisting of an aromatic hydrocarbon group, an aromatic heterocyclic group, and a fused polycyclic aromatic group" represented by $R_1$ to $R_8$ in the general formula (2), these groups ($R_1$ to $R_8$) may form a ring with a single bond via the "aromatic hydrocarbon group", "aromatic heterocyclic group", or "fused polycyclic aromatic group" of these groups ($R_1$ to $R_8$), or may be bonded to each other via a substituted or unsubstituted methylene group, an oxygen atom, or a sulfur atom to form a ring. These groups ($R_1$ to $R_8$) and a benzene ring to which these groups ($R_1$ to $R_8$) are directly bonded, may be bonded to each other via "aromatic hydrocarbon group", "aromatic heterocyclic group", or "fused polycyclic aromatic group" of these groups ($R_1$ to $R_8$) and a linking group such as a substituted or unsubstituted methylene group, an oxygen atom, a sulfur atom, and a monoarylamino group to form a ring.

Examples of the "linear or branched alkyl group having 1 to 6 carbon atoms" in the "linear or branched alkyl group having 1 to 6 carbon atoms which may have a substituted group" represented by $R_9$ and $R_{10}$ in the general formula (2) include the similar ones as described for the "linear or branched alkyl group having 1 to 6 carbon atoms" in the "linear or branched alkyl group having 1 to 6 carbon atoms which may have a substituted group" represented by $R_1$ to $R_8$ in the general formula (2). These groups may form a ring with a single bond, or may be bonded to each other via a substituted or unsubstituted methylene group, an oxygen atom, or a sulfur atom to form a ring.

Further, these divalent groups may have a substituted group. Examples of the substituted group include the similar ones as described for the "substituted group" in the "linear or branched alkyl group having 1 to 6 carbon atoms which has a substituted group", "cycloalkyl group having 5 to 10 atoms which has a substituted group", or "linear or branched alkenyl group having 2 to 6 atoms which has a substituted group" represented by $R_1$ to $R_8$ in the general formula (2), and aspects similar to those of the "substituted group" in the "linear or branched alkyl group having 1 to 6 carbon atoms which has a substituted group", "cycloalkyl group having 5 to 10 atoms which has a substituted group", or "linear or branched alkenyl group having 2 to 6 atoms which has a substituted group" represented by $R_1$ to $R_8$ in the general formula (2) can be taken.

Examples of the "aromatic hydrocarbon group", "aromatic heterocyclic group", or "fused polycyclic aromatic group" in the "substituted or unsubstituted aromatic hydrocarbon group", "substituted or unsubstituted aromatic heterocyclic group", or "substituted or unsubstituted fused polycyclic aromatic group" represented by $R_9$ and $R_{10}$ in the general formula (2) include the similar ones as described for the "aromatic hydrocarbon group", "aromatic heterocyclic group", or "fused polycyclic aromatic group" in the "substituted or unsubstituted aromatic hydrocarbon group", "substituted or unsubstituted aromatic heterocyclic group", or "substituted or unsubstituted fused polycyclic aromatic group" represented by $Ar_1$ to $Ar_8$ in the general formulae (1) and (1a). These groups may form a ring with a single bond, or may be bonded to each other via a substituted or unsubstituted methylene group, an oxygen atom, or a sulfur atom to form a ring.

Further, these divalent groups may have a substituted group. Examples of the substituted group include the similar ones as described for the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a), and aspects similar to those of the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a) can be taken.

Examples of the "aryl group" in the linking group "monoarylamino group" in the general formula (2) include the similar ones as described for the "aromatic hydrocarbon group", "aromatic heterocyclic group", or "fused polycyclic aromatic group" in the "substituted or unsubstituted aromatic hydrocarbon group", "substituted or unsubstituted aromatic heterocyclic group", or "substituted or unsubstituted fused polycyclic aromatic group" represented by $Ar_1$ to $Ar_8$ in the general formulae (1) and (1a).

Further, these substituted groups may have a substituted group. Examples of the substituted group include the similar ones as described for the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a), and aspects similar to those of the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a) can be taken.

The "substituted or unsubstituted aromatic hydrocarbon divalent group", "substituted or unsubstituted aromatic heterocyclic divalent group", or "substituted or unsubstituted fused polycyclic aromatic divalent group represented by $A_2$ in the general formula (3) include the similar ones as described for the "substituted or unsubstituted aromatic hydrocarbon divalent group", "substituted or unsubstituted aromatic heterocyclic divalent group", or "substituted or unsubstituted fused polycyclic aromatic divalent group" represented by $A_1$ in the general formula (2), and aspects similar to those of the "substituted or unsubstituted aromatic hydrocarbon divalent group", "substituted or unsubstituted aromatic heterocyclic divalent group", or "substituted or unsubstituted fused polycyclic aromatic divalent group" represented by $A_1$ in the general formula (2) can be taken.

Examples of the "substituted or unsubstituted aromatic hydrocarbon group", "substituted or unsubstituted aromatic heterocyclic group", or "substituted or unsubstituted fused polycyclic aromatic group" represented by $Ar_{10}$ in the general formula (3) include the similar ones as described for the "substituted or unsubstituted aromatic hydrocarbon group", "substituted or unsubstituted aromatic heterocyclic group", or "substituted or unsubstituted fused polycyclic aromatic group" represented by Arg in the general formula (2), and aspects similar to those of the "substituted or unsubstituted aromatic hydrocarbon group", "substituted or unsubstituted aromatic heterocyclic group", or "substituted or unsubstituted fused polycyclic aromatic group" represented by Arg in the general formula (2) can be taken.

Examples of the "linear or branched alkyl group having 1 to 6 carbon atoms which may have a substituted group", "cycloalkyl group having 5 to 10 atoms which may have a substituted group", or "linear or branched alkenyl group having 2 to 6 atoms which may have a substituted group" represented by $R_{11}$ to $R_{18}$ in the general formula (3) include the similar ones as described for the "linear or branched alkyl group having 1 to 6 carbon atoms which may have a substituted group", "cycloalkyl group having 5 to 10 atoms which may have a substituted group", or "linear or branched alkenyl group having 2 to 6 atoms which may have a substituted group" represented by $R_1$ to $R_8$ in the general formula (2), and aspects similar to those of the "linear or branched alkyl group having 1 to 6 carbon atoms which may have a substituted group", "cycloalkyl group having 5 to 10 atoms which may have a substituted group", or "linear or branched alkenyl group having 2 to 6 atoms which may have a substituted group" represented by $R_1$ to $R_8$ in the general formula (2) can be taken.

Examples of the "linear or branched alkyloxy group having 1 to 6 carbon atoms which may have a substituted group" or "cycloalkyloxy group having 5 to 10 carbon atoms which may have a substituted group" represented by $R_{11}$ to $R_{18}$ in the general formula (3) include the similar ones as described for the "linear or branched alkyloxy group having 1 to 6 carbon atoms which may have a substituted group" or "cycloalkyloxy group having 5 to 10 carbon atoms which may have a substituted group" represented by $R_1$ to $R_8$ in the general formula (2), and aspects similar to those of the "linear or branched alkyloxy group having 1 to 6 carbon atoms which may have a substituted group" or "cycloalkyloxy group having 5 to 10 carbon atoms which may have a substituted group" represented by $R_1$ to $R_8$ in the general formula (2) can be taken.

Examples of the "substituted or unsubstituted aromatic hydrocarbon group", "substituted or unsubstituted aromatic heterocyclic group", or "substituted or unsubstituted fused polycyclic aromatic group" represented by $R_{11}$ to $R_{18}$ in the general formula (3) include the similar ones as described for the "substituted or unsubstituted aromatic hydrocarbon group", "substituted or unsubstituted aromatic heterocyclic group", or "substituted or unsubstituted fused polycyclic aromatic group" represented by $R_1$ to $R_8$ in the general formula (2), and aspects similar to those of the "substituted or unsubstituted aromatic hydrocarbon group", "substituted or unsubstituted aromatic heterocyclic group", or "substituted or unsubstituted fused polycyclic aromatic group" represented by $R_1$ to $R_8$ in the general formula (2) can be taken.

Examples of the "substituted or unsubstituted aryloxy group" represented by $R_{11}$ to $R_{18}$ in the general formula (3) include the similar ones as described for the "substituted or unsubstituted aryloxy group" represented by $R_1$ to $R_8$ in the general formula (2), and aspects similar to those of the "substituted or unsubstituted aryloxy group" represented by $R_1$ to $R_8$ in the general formula (2) can be taken.

Examples of the "disubstituted amino group substituted with a group selected from the group consisting of an aromatic hydrocarbon group, an aromatic heterocyclic group, and a fused polycyclic aromatic group" represented by $R_{11}$ to $R_{18}$ in the general formula (3) include the similar ones as described for the "disubstituted amino group substituted with a group selected from the group consisting of an aromatic hydrocarbon group, an aromatic heterocyclic group, and a fused polycyclic aromatic group" represented by $R_1$ to $R_8$ in the general formula (2), and aspects similar to those of the "disubstituted amino group substituted with a group selected from the group consisting of an aromatic hydrocarbon group, an aromatic heterocyclic group, and a fused polycyclic aromatic group" represented by $R_1$ to $R_8$ in the general formula (2) can be taken.

Examples of the "aryl group" in the linking group "monoarylamino group" in the general formula (3) include the similar ones as described for the linking group "monoarylamino group" in the general formula (2), and aspects similar to those of the linking group "monoarylamino group" in the general formula (2) can be taken.

Specific examples of the "aromatic hydrocarbon group" or "fused polycyclic aromatic group" in the "substituted or unsubstituted aromatic hydrocarbon group" or "substituted or unsubstituted fused polycyclic aromatic group" represented by $Ar_{11}$, $Ar_{12}$, and $Ar_{13}$ in the general formula include a phenyl group, a biphenylyl group, a terphenylyl group, a tetrakisphenyl group, a styryl group, a naphthyl group, an anthracenyl group, an acenaphthenyl group, a phenanthrenyl group, a fluorenyl group, an indenyl group, a pyrenyl group, a perylenyl group, a fluoranthenyl group, and a triphenylenyl group.

Further, these divalent groups may have a substituted group. Examples of the substituted group include the similar ones as described for the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a), and aspects similar to those of the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a) can be taken.

Specific examples of the "aromatic heterocyclic group" in the "substituted or unsubstituted aromatic heterocyclic group" represented by $Ar_{14}$ represented by the general formula (4) include a triazinyl group, a pyridyl group, a pyrimidinyl group, a furil group, a pyrrolyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, an acridinyl group, and a carbolinyl group.

Further, these divalent groups may have a substituted group. Examples of the substituted group include the similar ones as described for the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a), and aspects similar to those of the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a) can be taken.

Specific examples of the "linear or branched alkyl group having 1 to 6 carbon atoms" represented by $R_{19}$ to $R_{22}$ in the general formula (4) include a methyl group, an ethyl group, an n-propyl group, an i-propyl group, an n-butyl group, a 2-methylpropyl group, a t-butyl group, an n-pentyl group, a 3-methylbutyl group, a tert-pentyl group, an n-hexyl group, an iso-hexyl group, and a tert-hexyl group.

Specific examples of the "aromatic hydrocarbon group", "aromatic heterocyclic group", or "fused polycyclic aromatic group" in the "substituted or unsubstituted aromatic hydrocarbon group", "substituted or unsubstituted aromatic heterocyclic group", or "substituted or unsubstituted fused polycyclic aromatic group" represented by $R_{19}$ to $R_{22}$ in the general formula (4) include a phenyl group, a biphenylyl group, a terphenylyl group, a tetrakisphenyl group, a styryl group, a naphthyl group, an anthracenyl group, an acenaphthenyl group, a phenanthrenyl group, a fluorenyl group, an indenyl group, a pyrenyl group, a perylenyl group, a fluoranthenyl group, a triphenylenyl group, a triazinyl group, a pyridyl group, a pyrimidinyl group, a furil group, a pyrrolyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, an acridinyl group, and a carbolinyl group.

Further, these divalent groups may have a substituted group. Examples of the substituted group include the similar ones as described for the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a), and aspects similar to those of the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a) can be taken.

As the "substituted group" in the "substituted aromatic hydrocarbon group", "substituted aromatic heterocyclic group", or "substituted fused polycyclic aromatic group" represented by $Ar_1$ to $Ar_8$ in the general formulae (1) and (1a), a deuterium atom, a linear or branched alkyl group having 1 to 6 carbon atoms which may have a substituted group, a linear or branched alkenyl group having 2 to 6 atoms which may have a substituted group, a "substituted or unsubstituted aromatic hydrocarbon group", or a "substituted or unsubstituted fused polycyclic aromatic group" is favorable, and a deuterium atom, a phenyl group, a biphenylyl group, a naphthyl group, or a vinyl group is more favorable. Further, an aspect in which these groups are bonded to each other via a single bond to form a fused aromatic ring is also favorable.

In the general formulae (1) and (1a), n1 represents 0, or 1 to 2. n1 being 0 indicates that two diarylaminobenzene rings are bonded to each other directly (with a single bond), n1 being 1 indicates that two diarylaminobenzene rings are bonded to each other via one phenylene group, and n1 being 2 indicates that two diarylaminobenzene rings are bonded to each other via two phenylene groups (biphenylene group).

In the general formulae (1) and (1a), it is favorable that n1 is 0, i.e., two diarylaminobenzene rings are bonded to each other directly (with a single bond).

An aspect in which in the general formulae (1) and (1a), $Ar_3$ or $Ar_4$ forms, with a single bond, a ring with a benzene ring to which an $Ar_3Ar_4$—N group (diarylamino group formed of $Ar_3$, $Ar_4$, and a nitrogen atom to which $Ar_3$ and $Ar_4$ are bonded) is bonded or an aspect in which $Ar_3$ or $Ar_4$ is bonded to the benzene ring via an substituted or unsubstituted methylene group, an oxygen atom, or a sulfur atom to form a ring is also favorable. In this case, the bonding position in the benzene ring is favorably a position adjacent to the $Ar_3Ar_4$—N group.

As $A_1$ in the general formula (2), a "substituted or unsubstituted aromatic hydrocarbon divalent group", "substituted or unsubstituted fused polycyclic aromatic divalent group, or a single bond is favorable, a divalent group formed by removing two hydrogen atoms from benzene, biphenyl, or naphthalene, or a single bond is more favorable, and a divalent group formed by removing two hydrogen atoms from benzene, or a single bond is particularly favorable.

As Ar9 in the general formula (2), a phenyl group, a biphenylyl group, a naphthyl group, or an "aromatic heterocyclic group" is favorable. Among the "aromatic heterocyclic groups", a triazinyl group, a quinazolinyl group, a naphthopyrimidinyl group, a benzimidazolyl group, a pyridopyrimidinyl group, a naphthyridinyl group, a pyridyl group, a quinolyl group, or an isoquinolyl group is particularly favorable.

An aspect in which in the general formula (2), adjacent two of $R_1$ to $R_4$ are a "linear or branched alkenyl group having 2 to 6 atoms", "aromatic hydrocarbon group", "aromatic heterocyclic group", or "fused polycyclic aromatic group", and the adjacent two groups ($R_1$ to $R_4$) are bonded to each other via a single bond to form a fused ring with a benzene ring to which $R_1$ to $R_4$ are bonded is favorable. In this case, as the "linear or branched alkenyl group having 2 to 6 atoms", "aromatic hydrocarbon group", "aromatic heterocyclic group", or "fused polycyclic aromatic group", a vinyl group or a phenyl group is favorable, and an aspect in which a naphthalene ring, phenanthrene ring, or triphenylene ring is formed with a benzene ring to which $R_1$ to $R_4$ are bonded is favorable.

An aspect in the general formula (2), any of $R_1$ to $R_4$ is an "aromatic hydrocarbon group", "aromatic heterocyclic group", or "fused polycyclic aromatic group" and is bonded, via a substituted or unsubstituted methylene group, an oxygen atom, a sulfur atom, or a linking group such as a monoarylamino group, to a benzene ring to which $R_1$ to $R_4$ are bonded to form a ring is favorable. In this case, as the "aromatic hydrocarbon group", "aromatic heterocyclic group", or "fused polycyclic aromatic group", a phenyl group, an indenyl group, an indolyl group, a benzofuranyl group, or a benzothienyl group is favorable, and an aspect in which a fluorine ring, a carbazole ring, a dibenzofuran ring, a dibenzothiophene ring, an indenoindole ring, an indenobenzofuran ring, an indenobenzothiophene ring, a benzofurindole ring, a benzothienoindole ring, an indoloindole ring is formed with a benzene rig to which $R_1$ to $R_4$ are bonded is favorable.

As the aspect in which $R_1$ to $R_4$ are bonded to each other to form a ring among the heterocyclic compounds having a fused ring structure represented by the general formula (2) or the aspect in which $R_1$ to $R_4$ and a benzene ring to which $R_1$ to $R_4$ are bonded are bonded to each other to form a ring as described above, an aspect represented by the following general formula (2a), (2b), (2c), (2d), or (2e) is favorably used.

(Chem. 6)

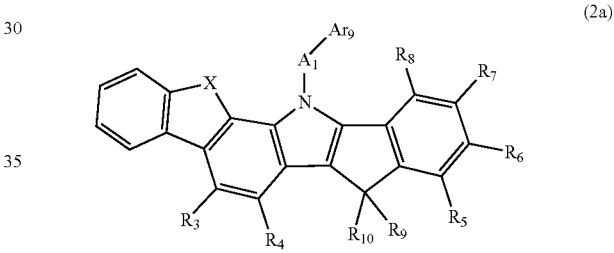

(2a)

(In the general formula, X represents a substituted or unsubstituted methylene group, an oxygen atom, a sulfur atom, or a monoarylamino group, and Arg, $R_1$ to $R_8$, $R_9$, and $R_{10}$ have the same meanings as shown in the general formula (2).)

(Chem. 7)

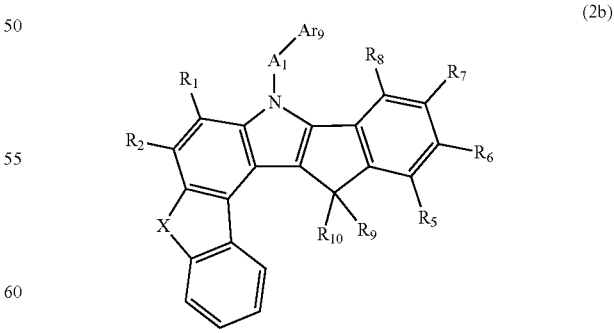

(2b)

(In the formula, X represents a substituted or unsubstituted methylene group, an oxygen atom, a sulfur atom, or a monoarylamino group, and $Ar_9$, $R_1$ to $R_8$, $R_9$, and $R_{10}$ have the same meanings as shown in the general formula (2).)

(Chem. 8)

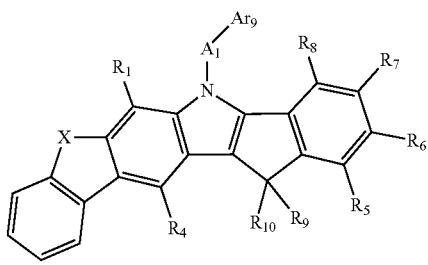

(2c)

(In the general formula, X represents a substituted or unsubstituted methylene group, an oxygen atom, a sulfur atom, or a monoarylamino group, and Arg, $R_1$ to $R_8$, $R_9$, and $R_{10}$ have the same meanings as shown in the general formula (2).)

(Chem. 9)

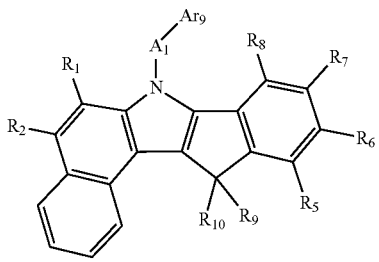

(2d)

(In the general formula, X represents a substituted or unsubstituted methylene group, an oxygen atom, a sulfur atom, or a monoarylamino group, and Arg, $R_1$ to $R_8$, $R_9$, and $R_{10}$ have the same meanings as shown in the general formula (2).)

(Chem. 10)

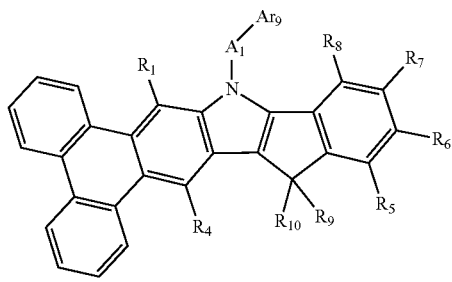

(2e)

(In the general formula, X represents a substituted or unsubstituted methylene group, an oxygen atom, a sulfur atom, or a monoarylamino group, and Arg, $R_1$ to $R_8$, $R_9$, and $R_{10}$ have the same meanings as shown in the general formula (2).)

An aspect in which in the general formula (2), adjacent two of $R_5$ to $R_8$ or all of them are each a vinyl group and the adjacent two vinyl groups are bonded to each other via a single bond to form a fused ring, i.e., an aspect in which a naphthalene ring or a phenanthrene ring is formed with a benzene ring to which $R_5$ to $R_8$ are bonded is also favorable.

As $R_9$ and $R_{10}$ in the general formula (2), a "linear or branched alkyl group having 1 to 6 carbon atoms" is favorable, and a methyl group is particularly favorable.

As $A_2$ in the general formula (3), a "substituted or unsubstituted aromatic hydrocarbon divalent group", "substituted or unsubstituted fused polycyclic aromatic divalent group, or a single bond is favorable, a divalent group formed by removing two hydrogen atoms from benzene, biphenyl, or naphthalene, or a single bond is more favorable, and a divalent group formed by removing two hydrogen atoms from benzene, or a single bond is particularly favorable.

As $Ar_{10}$ in the general formula (3), a phenyl group, a biphenylyl group, a naphthyl group, or an "aromatic heterocyclic group" is favorable, and among the "aromatic heterocyclic groups", a triazinyl group, a quinazolinyl group, a naphthopyrimidinyl group, a benzimidazolyl group, a pyridopyrimidinyl group, a naphthyridinyl group, a pyridyl group, a quinolyl group, and an isoquinolyl group are particularly favorable.

An aspect in which in the general formula (3), adjacent two of $R_{11}$ to $R_{14}$ are a "linear or branched alkenyl group having 2 to 6 atoms", "aromatic hydrocarbon group", "aromatic heterocyclic group", or "fused polycyclic aromatic group" and the adjacent two groups ($R_{11}$ to $R_{14}$) are bonded to each other via a single bond to form a fused ring with a benzene ring to which $R_{11}$ to $R_{14}$ are bonded is favorable. In this case, as the "linear or branched alkenyl group having 2 to 6 atoms", "aromatic hydrocarbon group", "aromatic heterocyclic group", or "fused polycyclic aromatic group", a vinyl group or a phenyl group is favorable, and an aspect in which a naphthalene ring, a phenanthrene ring, or a triphenylene ring is formed with a benzene ring to which $R_{11}$ to $R_{14}$ are formed is favorable.

An aspect in which in the general formula (3), any of $R_{11}$ to $R_{14}$ is an "aromatic hydrocarbon group", "aromatic heterocyclic group", or "fused polycyclic aromatic group" and is bonded, via a substituted or unsubstituted methylene group, an oxygen atom, a sulfur atom, or a linking group such as a monoarylamino group, to a benzene ring to which $R_{11}$ to $R_{14}$ are bonded to form a ring is favorable. In this case, as the "aromatic hydrocarbon group", "aromatic heterocyclic group", or "fused polycyclic aromatic group", a phenyl group, an indenyl group, an indolyl group, a benzofuranyl group, or a benzothienyl group is favorable, and an aspect in which a fluorine ring, a carbazole ring, a dibenzofuran ring, a dibenzothiophene ring, an indenoindole ring, an indenobenzofuran ring, an indenobenzothiophene ring, a benzofurindole ring, a benzothienoindole ring, or an indoloindole ring is formed with a benzene ring to which $R_{11}$ to $R_{14}$ are bonded is favorable.

As the aspect in which $R_{11}$ to $R_{14}$ and a benzene ring to which $R_{11}$ to $R_{14}$ are bonded are bonded to each other to form a ring as described above, an aspect represented by the following general formula (3a-1), (3a-2), (3a-3), (3a-4), or (3b-1) is favorable.

(Chem. 11)

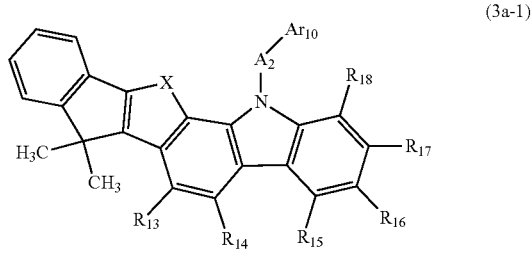

(3a-1)

(In the formula, X represents a substituted or unsubstituted methylene group, an oxygen atom, a sulfur atom, or a monoarylamino group, and $Ar_{10}$ and $R_{11}$ to $R_{18}$ have the same meanings as shown in the general formula (3).)

(Chem. 12)

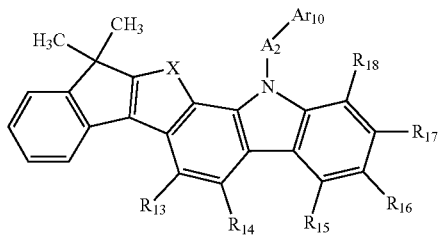

(3a-2)

(In the formula, X represents a substituted or unsubstituted methylene group, an oxygen atom, a sulfur atom, or a monoarylamino group, and $Ar_{10}$ and $R_{11}$ to $R_{18}$ have the same meanings as shown in the general formula (3).)

(Chem. 13)

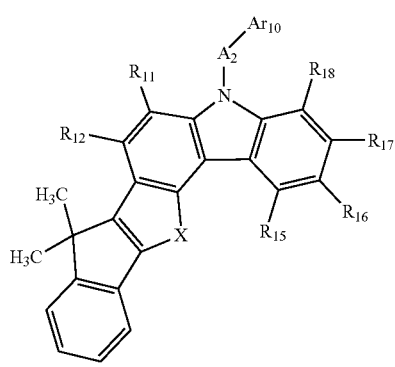

(3a-3)

(In the formula, X represents a substituted or unsubstituted methylene group, an oxygen atom, a sulfur atom, or a monoarylamino group, and $Ar_{10}$ and $R_{11}$ to $R_{18}$ have the same meanings as shown in the general formula (3).)

(Chem. 14)

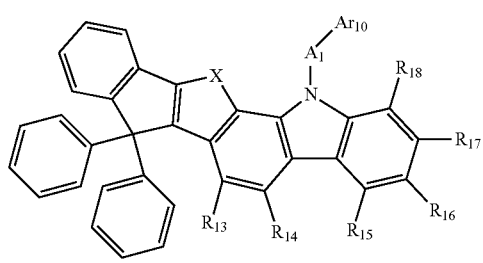

(3a-4)

(In the formula, X represents a substituted or unsubstituted methylene group, an oxygen atom, a sulfur atom, or a monoarylamino group, and $Ar_{10}$ and $R_{11}$ to $R_{18}$ have the same meanings as shown in the general formula (3).)

(Chem. 15)

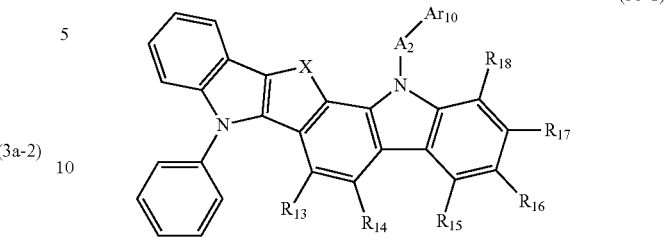

(3b-1)

(In the formula, X represents a substituted or unsubstituted methylene group, an oxygen atom, a sulfur atom, or a monoarylamino group, and $Ar_{10}$ and $R_{11}$ to $R_{18}$ have the same meanings as shown in the general formula (3).)

An aspect in which in the general formula (3), adjacent two of $R_{15}$ to $R_{18}$ or all of them are each a vinyl group, and the adjacent two vinyl groups are bonded to each other via a single bond to form a fused ring, i.e., an aspect in which a naphthalene ring or a phenanthrene ring is formed with a benzene ring to which $R_{15}$ to $R_{18}$ are bonded is also favorable.

An aspect in which in the general formula (3), any of $R_{15}$ to $R_{18}$ is an "aromatic hydrocarbon group", "aromatic heterocyclic group", or "fused polycyclic aromatic group" is also favorable. In this case, any of $R_{15}$ to $R_{18}$ is favorably a group selected from the group consisting of a fluorenyl group, a carbazolyl group, a dibenzofuranyl group, and a dibenzothienyl group. It is more favorable that $R_{16}$ is a fluorenyl group, a carbazolyl group, a dibenzofuranyl group, or a dibenzothienyl group, and $R_{15}$, $R_{17}$, and $R_{18}$ are each a hydrogen atom.

As $Ar_{11}$ in the general formula (4), a phenyl group, a biphenylyl group, a naphthyl group, an anthracenyl group, an acenaphthenyl group, a phenanthrenyl group, a fluorenyl group, an indenyl group, a pyrenyl group, a perylenyl group, a fluoranthenyl group, or a triphenylenyl group is favorable, and a phenyl group, a biphenylyl group, a naphthyl group, an anthracenyl group, a phenanthrenyl group, a pyrenyl group, a fluoranthenyl group, or a triphenylenyl group is more favorable. Here, a phenyl group favorably has a substituted or unsubstituted fused polycyclic aromatic group as a substituted group, and more favorably has a substituted group selected from the group consisting of a naphthyl group, an anthracenyl group, a phenanthrenyl group, a pyrenyl group, a fluoranthenyl group, and a triphenylenyl group.

As $Ar_{12}$ in the general formula (4), a phenyl group which has a substituted group is favorable. In this case, as the substituted group, an aromatic hydrocarbon group such as a phenyl group, a biphenylyl group, and a terphenyl group, or a fused polycyclic aromatic group such as a naphthyl group, an anthracenyl group, an acenaphthenyl group, a phenanthrenyl group, a fluorenyl group, an indenyl group, a pyrenyl group, a perylenyl group, a fluoranthenyl group, and a triphenylenyl group is favorable, and a phenyl group, a naphthyl group, an anthracenyl group, a phenanthrenyl group, a pyrenyl group, a fluoranthenyl group, or a triphenylenyl group is more favorable.

As $Ar_{13}$ in the general formula (4), a phenyl group which has a substituted group is favorable. In this case, as the substituted group, an aromatic hydrocarbon group such as a phenyl group, a biphenylyl group, and a terphenyl group, or a fused polycyclic aromatic group such as a naphthyl group, an anthracenyl group, an acenaphthenyl group, a phenanthrenyl group, a fluorenyl group, an indenyl group, a pyrenyl group, a perylenyl group, a fluoranthenyl group, and a triphenylenyl group is favorable, and a phenyl group, a naphthyl group, an anthracenyl group, a phenanthrenyl group, a pyrenyl group, a fluoranthenyl group, or a triphenylenyl group is more favorable.

In the general formula (4), it is favorable that $Ar_{11}$ and $Ar_{12}$ are not the same from the viewpoint of the stability in a thin film state. Here, the case where $Ar_{11}$ and $Ar_{12}$ are not the same indicates that they may be different substituted groups or they are at different substitution positions.

In the general formula (4), $Ar_{12}$ and $Ar_{13}$ may be the same group. However, since there is a possibility that they are likely to be crystallized because the symmetry of the whole molecule is improved, it is favorable from the viewpoint of the stability in a thin film state that $Ar_{15}$ and $Ar_{16}$ are different groups, and both $Ar_{12}$ and $Ar_{13}$ are not hydrogen atoms.

In the general formula (4), it is favorable that one of $Ar_{12}$ and $Ar_{13}$ is a hydrogen atom.

As $Ar_{14}$ in the general formula (4), a nitrogen-containing heterocyclic group such as a triazinyl group, a pyridyl group, a pyrimidinyl group, a pyrrolyl group, a quinolyl group, an isoquinolyl group, an indolyl group, a carbazolyl group, a benzoxazolyl group, a benzothiazolyl group, a quinoxalinyl group, a benzimidazolyl group, a pyrazolyl group, a naphthyridinyl group, a phenanthrolinyl group, an acridinyl group, or a carbolinyl group is favorable, a triazinyl group, a pyridyl group, a pyrimidinyl group, a quinolyl group, an isoquinolyl group, an indolyl group, a quinoxalinyl group, a benzimidazolyl group, a naphthyridinyl group, or a phenanthrolinyl group, an acridinyl group is more favorable, and a pyridyl group, a pyrimidinyl group, a quinolyl group, an isoquinolyl group, an indolyl group, a quinoxalinyl group, a benzimidazolyl group, a phenanthrolinyl group, or an acridinyl group is particularly favorable.

In the general formula (4), it is favorable from the viewpoint of the stability in a thin film state that the bonding position of $Ar_{14}$ in a benzene ring is a meta position with respect to the bonding position with a pyrimidine ring.

Examples of the compound having a pyrimidine ring structure represented by the general formula (4) include compounds having a pyrimidine ring structure represented by the following general formula (4a) and (4b), which have different binding forms of the substituted groups.

(Chem. 16)

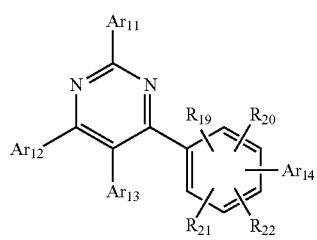

(4a)

(In the formula, $Ar_{11}$, $Ar_{12}$, $Ar_{13}$, $Ar_{14}$, and $R_{19}$ to $R_{22}$ have the same meanings as shown in the general formula (4).)

(Chem. 17)

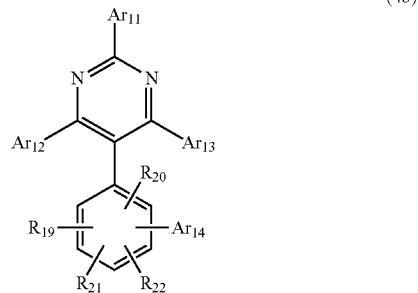

(4b)

(In the formula, $Ar_{11}$, $Ar_{12}$, $Ar_{13}$, $Ar_{14}$, and $R_{19}$ to $R_{22}$ have the same meanings as shown in the general formula (4).)

The arylamine compound represented by the general formula (1) or the general formula (1a), which is suitably used for the organic EL device according to the present invention can be used as a constituent material of a hole injection layer or a hole transport layer of an organic EL device. It has a high mobility of holes, and is a favorable compound as a material of a hole injection layer or a hole transport layer. Further, it has high electron blocking performance, and is a favorable compound as a material of a second hole transport layer in the case where the hole transport layer has a two-layer structure of a first hole transport layer and the second hole transport layer.

The heterocyclic compound having a fused ring structure represented by the general formula (2), which is suitably used for the organic EL device according to the present invention, and the heterocyclic compound having a fused ring structure represented by the general formula (3) can each be used as a constituent material of a light-emitting layer of an organic EL device. They have higher light emission efficiency than the existing materials, and are each favorable as a host material of a light-emitting layer, particularly, a host material of a light-emitting layer containing a phosphorescent light-emitting material.

The compound having a pyrimidine ring structure represented by the general formula (4), which is suitably used for the organic EL device according to the present invention, can be used as a constituent material of an electron transport layer of an organic EL device.

The compound having a pyrimidine ring structure represented by the general formula (4) has excellent electron injection/transport performance, stability in a thin film state, and durability, and is a favorable compound as a material of an electron transport layer.

Since in the organic EL device according to the present invention, materials for an organic EL device which is excellent in hole injecting/transporting performance, stability in a thin film state, and durability are combined with consideration of the carrier balance, the hole transport efficiency from the anode to the hole transport layer is improved as compared with the existing organic EL device, thereby making it possible to improve the light emission efficiency and the durability of the organic EL device while maintaining the low driving voltage.

It has been possible to realize an organic EL device that has a low driving voltage, high light emission efficiency, and a long lifetime.

Figure 2:
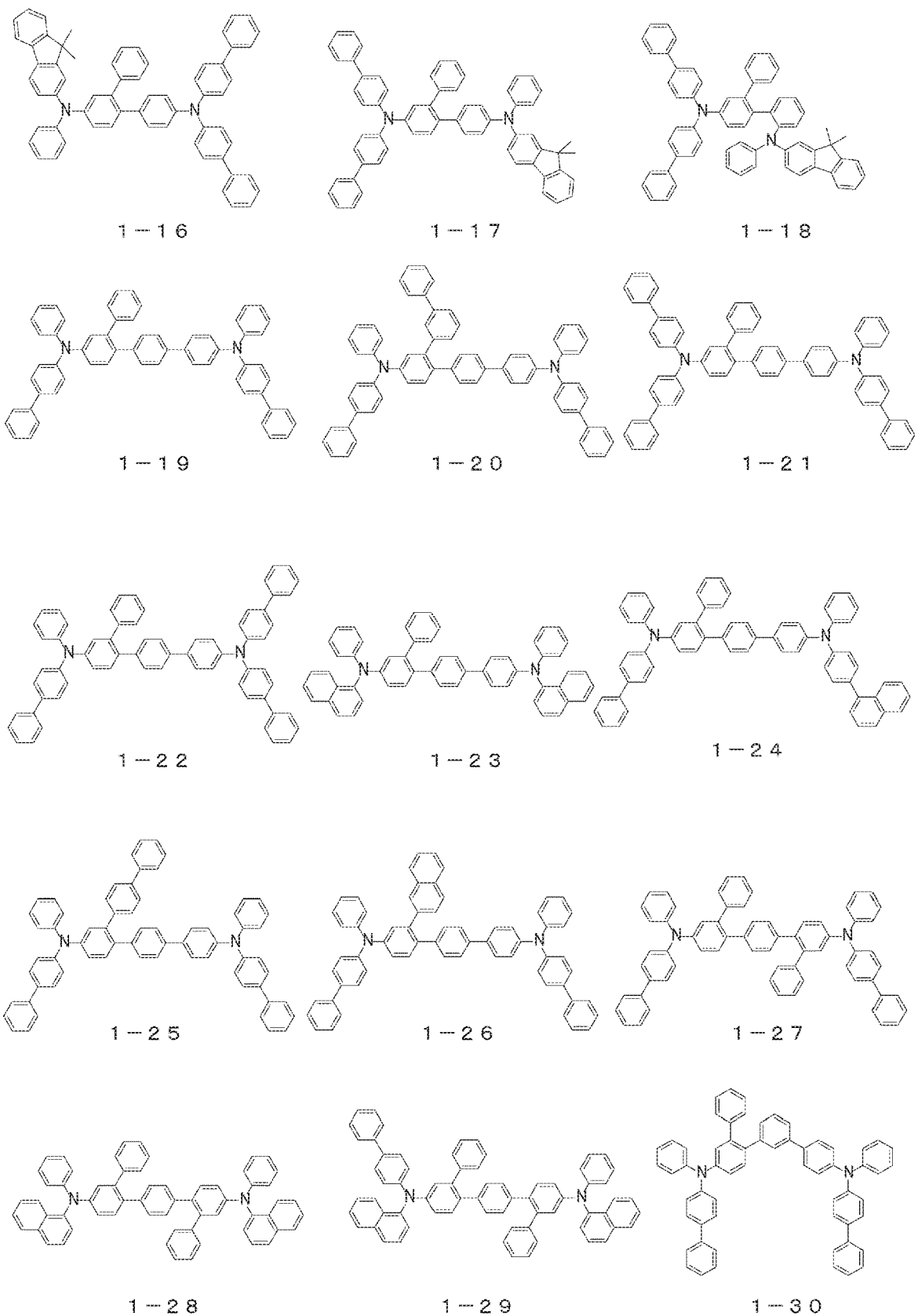
FIG. 2 is a diagram showing Compound 1-16 to Compound 1-30 that are arylamine compounds represented by the general formula (1) of the present invention.
Figure 3:
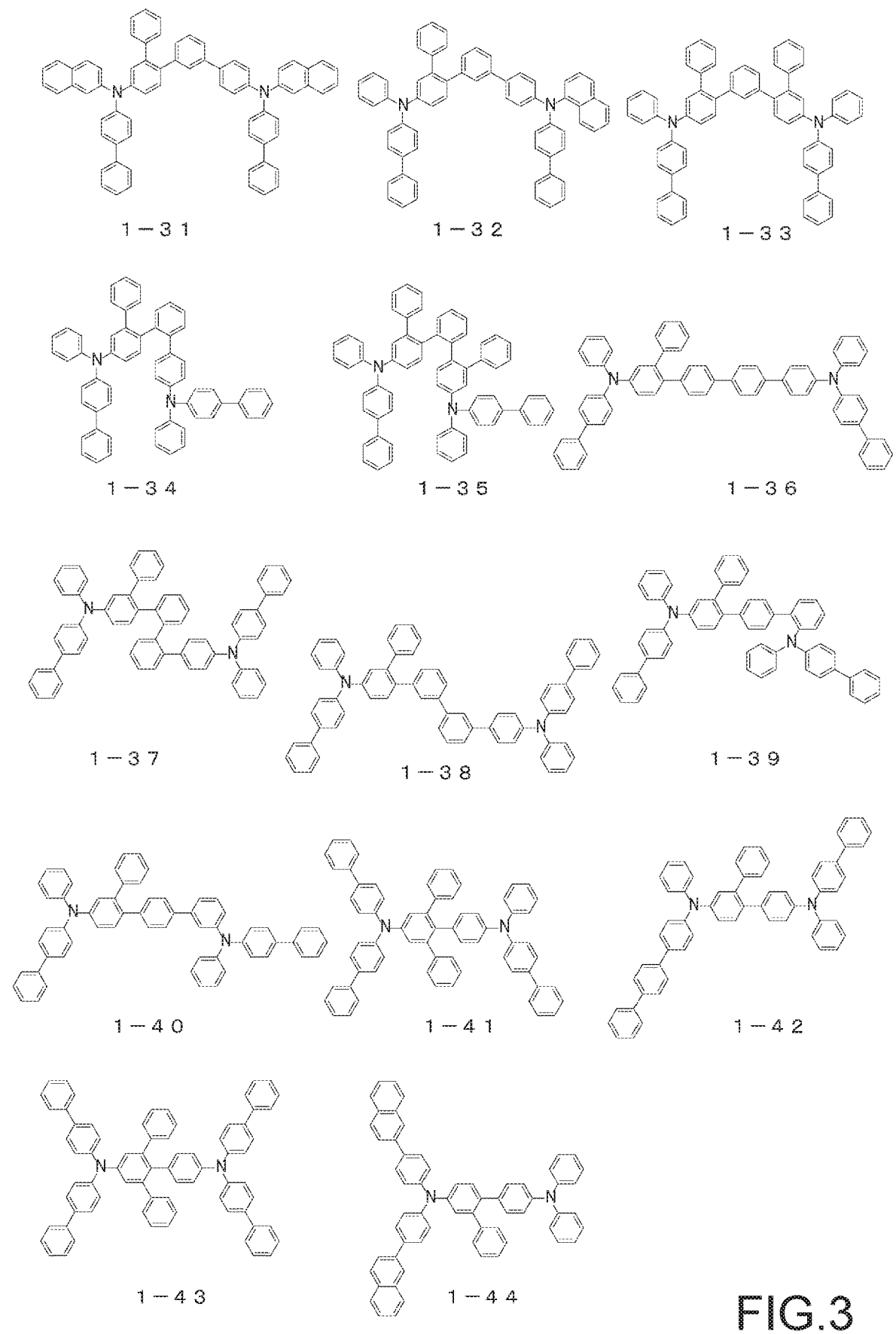
FIG. 3 is a diagram showing Compound 1-31 to Compound 1-44 that are arylamine compounds represented by the general formula (1) of the present invention.

Compounds 1-1 to 1-44 are shown in FIG. 1 to FIG. 3 as specific examples of favorable compounds among the arylamine compounds represented by the general formula (1), which are suitably used for the organic EL element according to the present invention. However, the present invention is not limited to these compounds.

Figure 4:
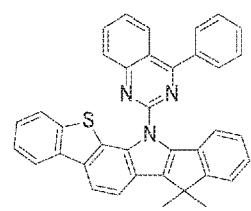
FIG. 4 is a diagram showing Compound 2-1 to Compound 2-15 that are heterocyclic compounds each having a fused ring structure represented by the general formula (2) of the present invention.
Figure 4:
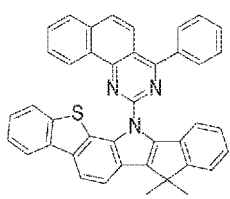
Figure 4:
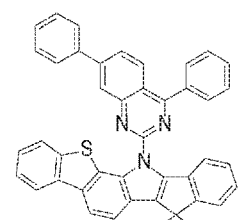
Figure 4:
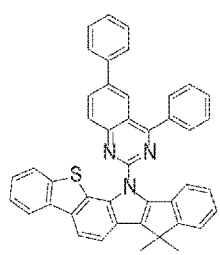
Figure 4:
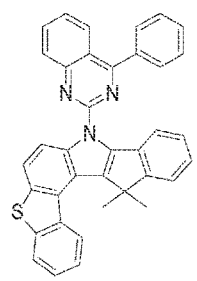
Figure 4:
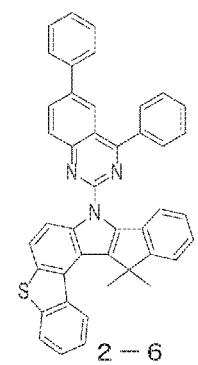
Figure 4:
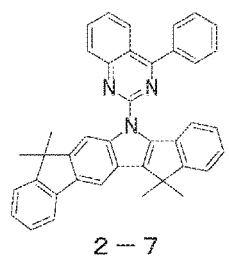
Figure 4:
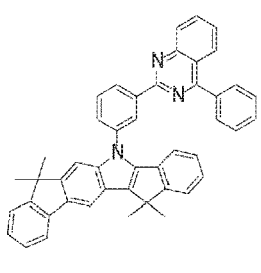
Figure 4:
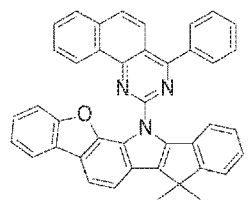
Figure 4:
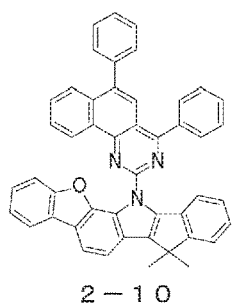
Figure 4:
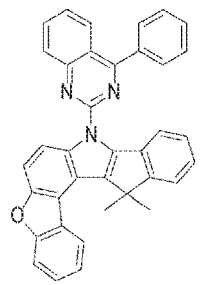
Figure 4:
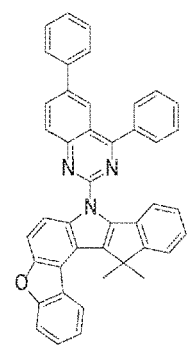
Figure 4:
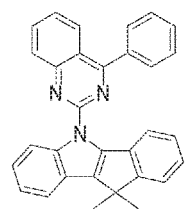
Figure 4:
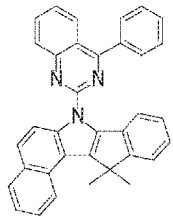
Figure 4:
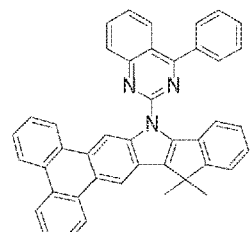

Compounds 2-1 to 2-15 are shown in FIG. 4 as specific examples of favorable compounds among the heterocyclic compounds having a fused ring structure represented by the general formula (2), which are suitably used for the organic EL element according to the present invention. However, the present invention is not limited to these compounds.

Figure 5:
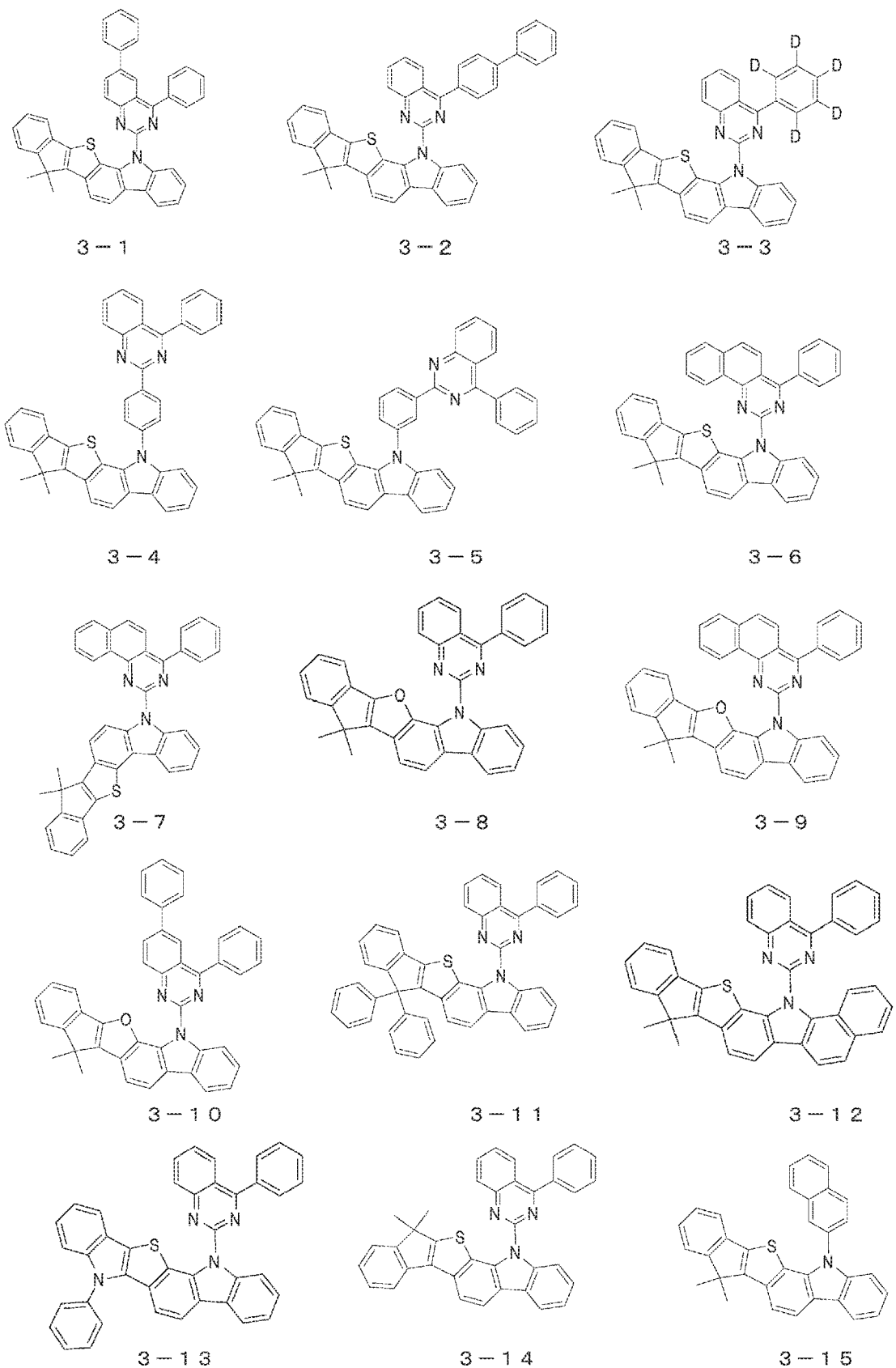
FIG. 5 is a diagram showing Compound 3-1 to Compound 3-15 that are heterocyclic compounds each having a fused ring structure represented by the general formula (3) of the present invention.
Figure 6:
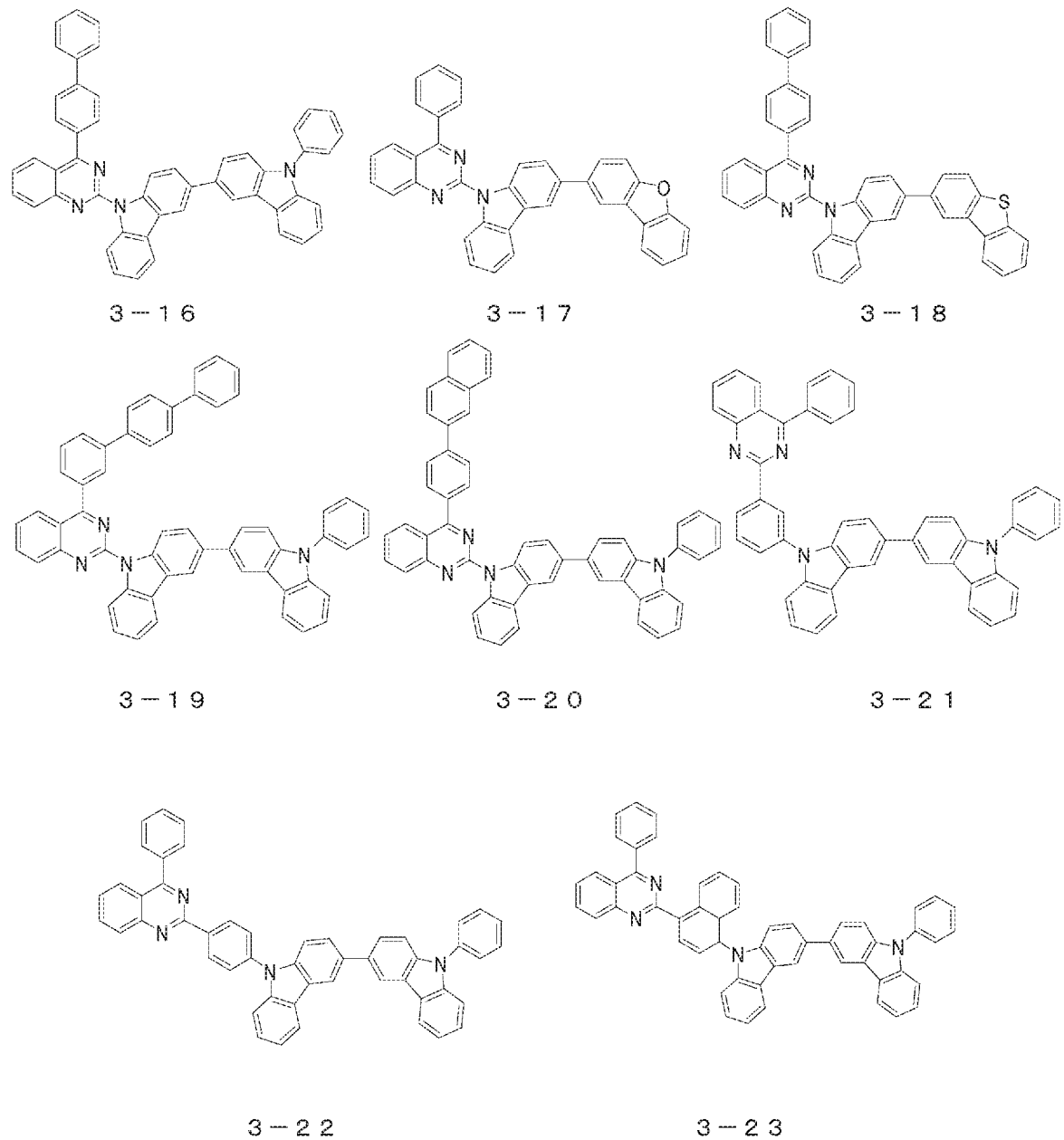
FIG. 6 is a diagram showing Compound 3-16 to Compound 3-23 that are heterocyclic compounds each having a fused ring structure represented by the general formula (3) of the present invention.

Compounds 3-1 to 3-23 are shown in FIGS. 5 and 6 as specific examples of favorable compounds among the heterocyclic compounds having a fused ring structure represented by the general formula (3), which are suitably used for the organic EL element according to the present invention. However, the present invention is not limited to these compounds.

Note that the above-mentioned heterocyclic compound having a fused ring structure can be synthesized in accordance with a method known per se (see, for example, Patent Literature 7).

Figure 7:
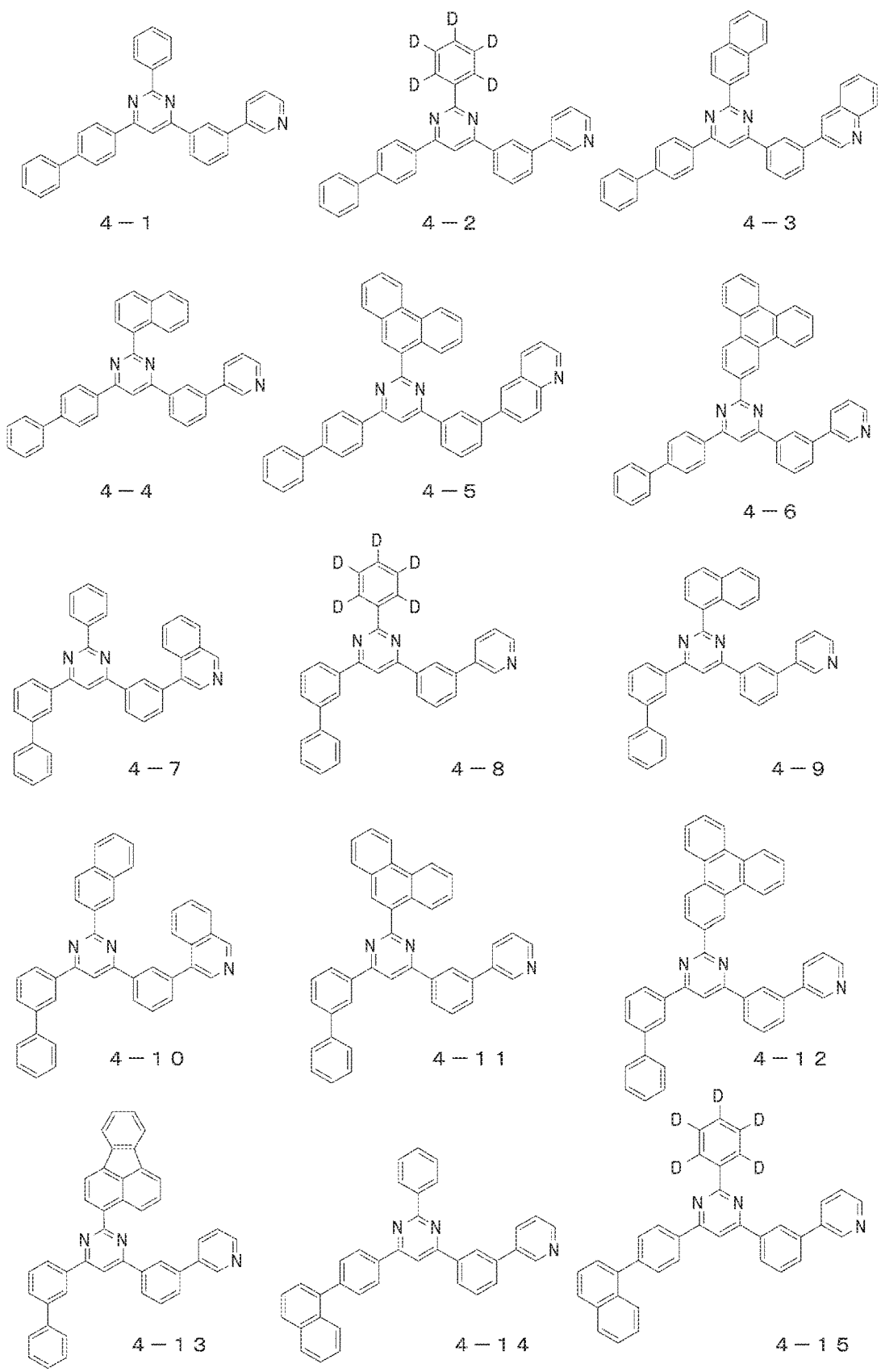
FIG. 7 is a diagram showing Compound 4-1 to Compound 4-15 that are pyrimidine ring compounds represented by the general formula (4) of the present invention.
Figure 8:
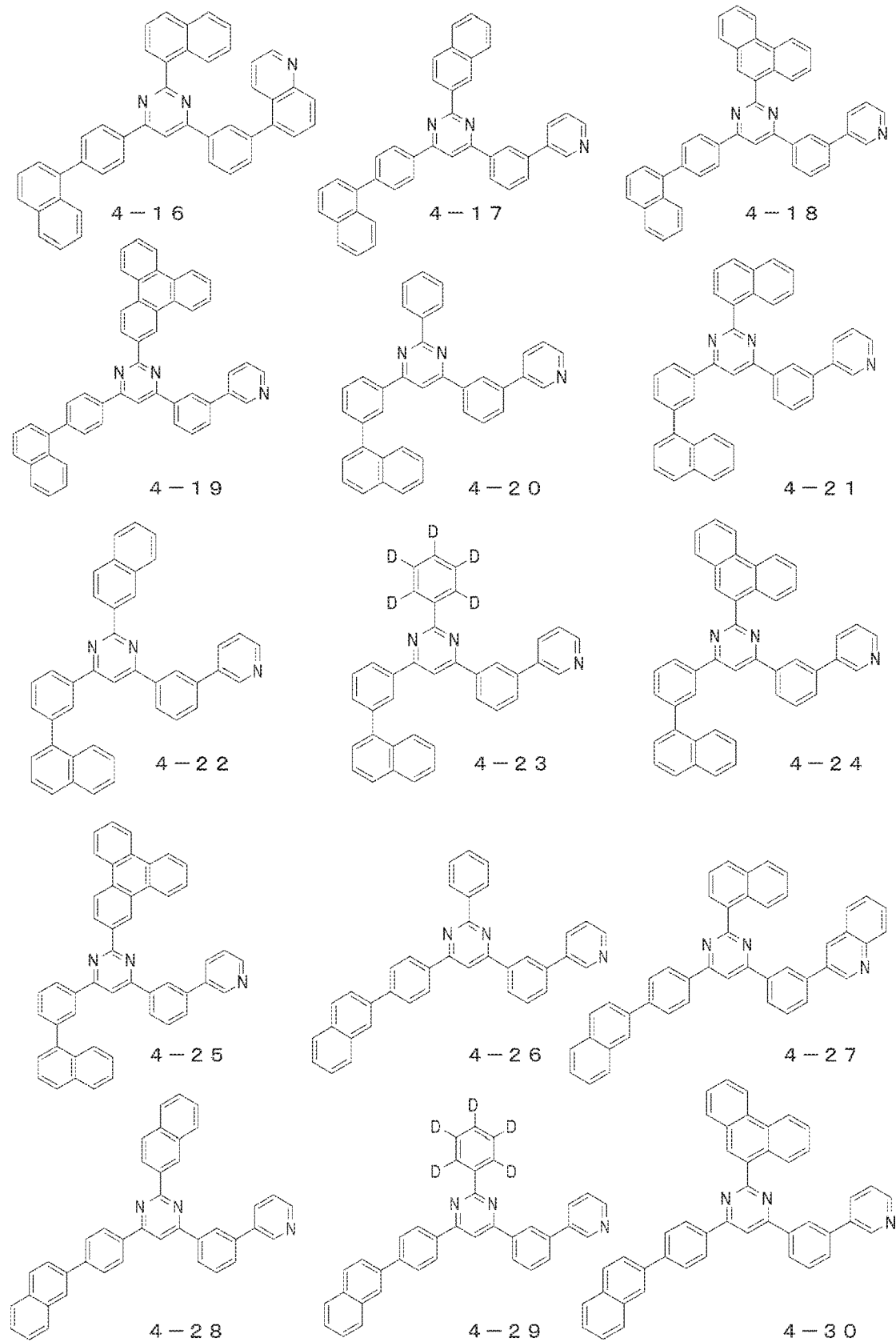
FIG. 8 is a diagram showing Compound 4-16 to Compound 4-30 that are pyrimidine ring compounds represented by the general formula (4) of the present invention.
Figure 9:
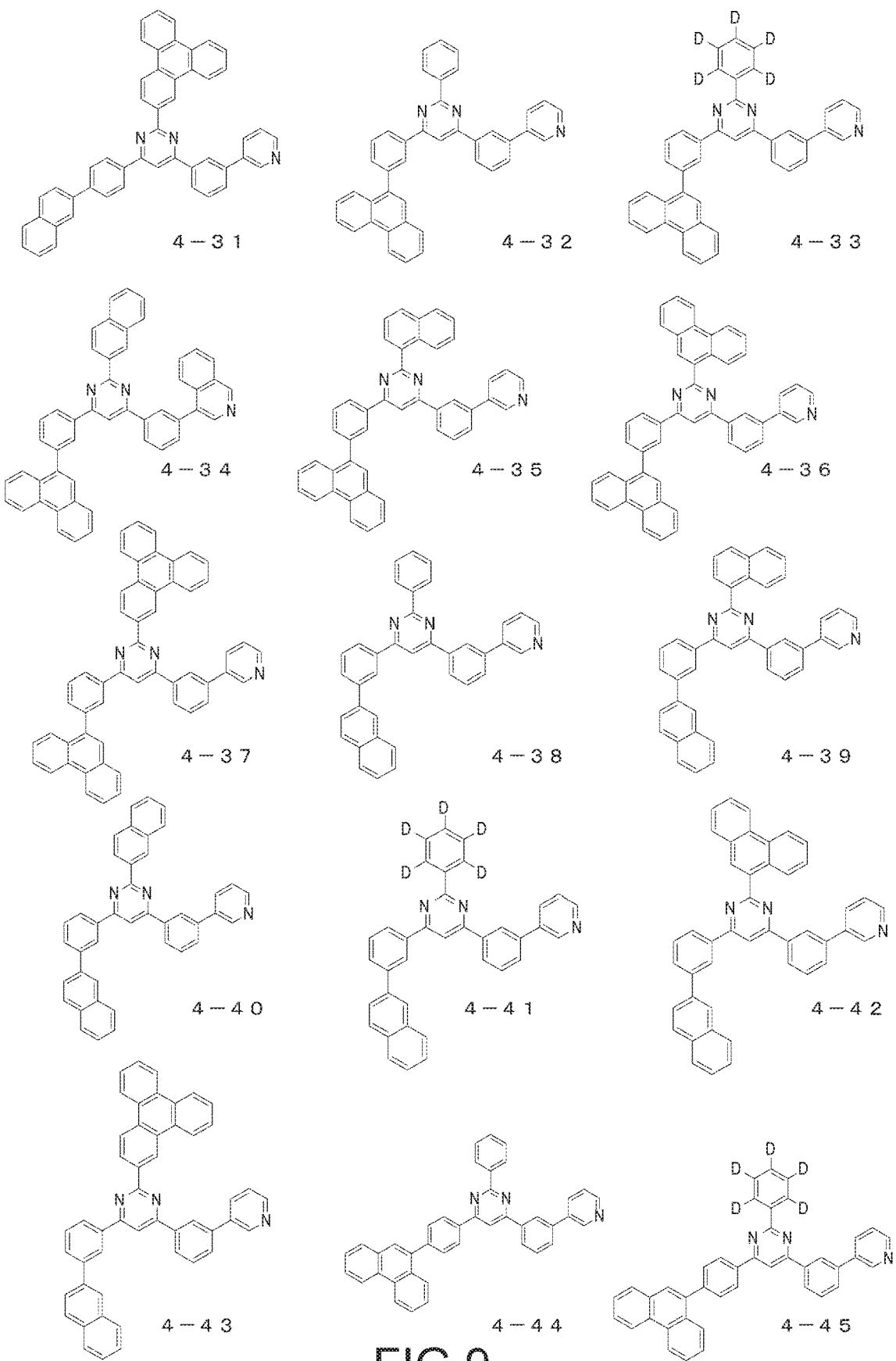
FIG. 9 is a diagram showing Compound 4-31 to Compound 4-45 that are pyrimidine ring compounds represented by the general formula (4) of the present invention.
Figure 10:
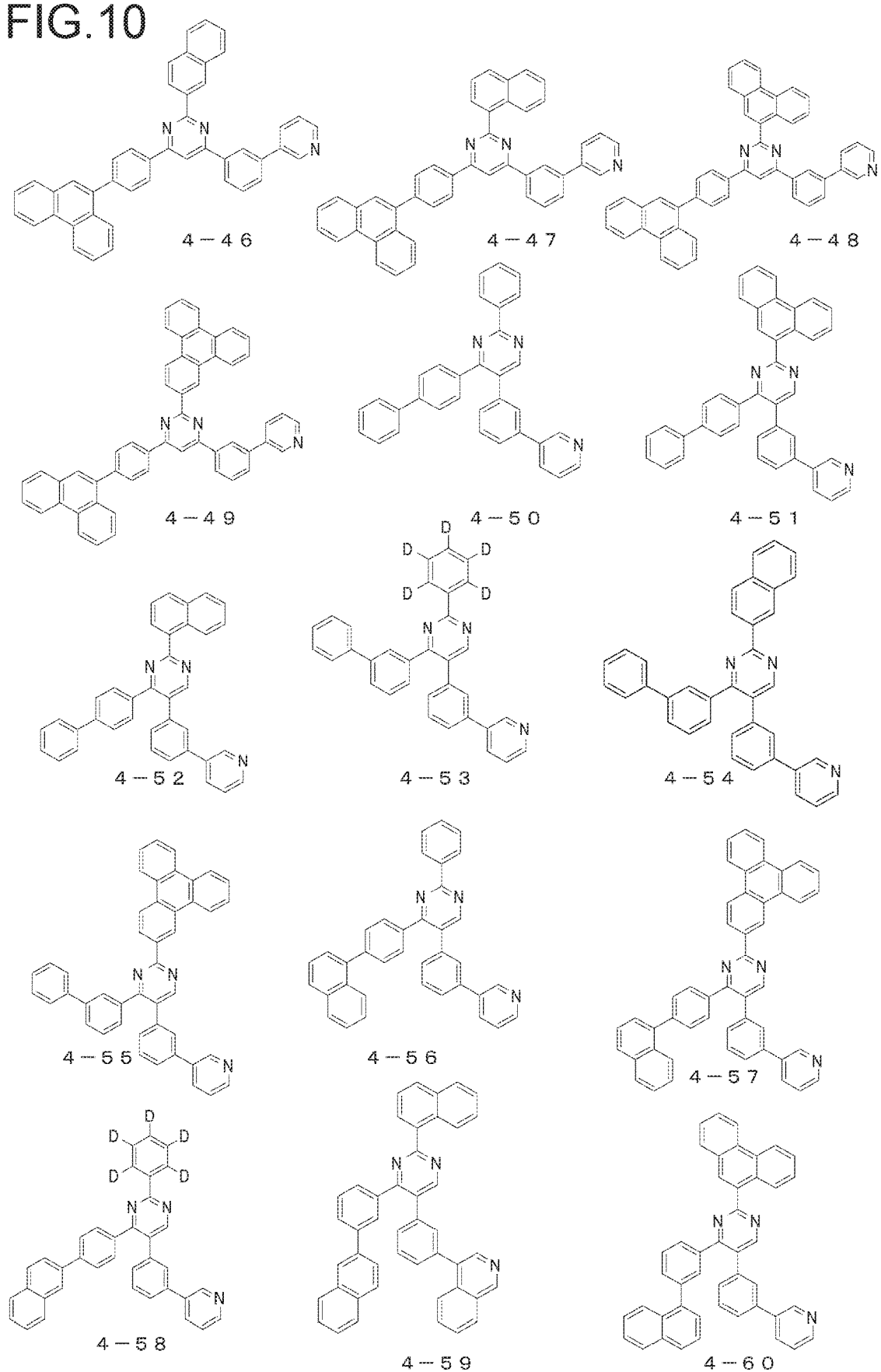
FIG. 10 is a diagram showing Compound 4-46 to Compound 4-60 that are pyrimidine ring compounds represented by the general formula (4) of the present invention.
Figure 11:
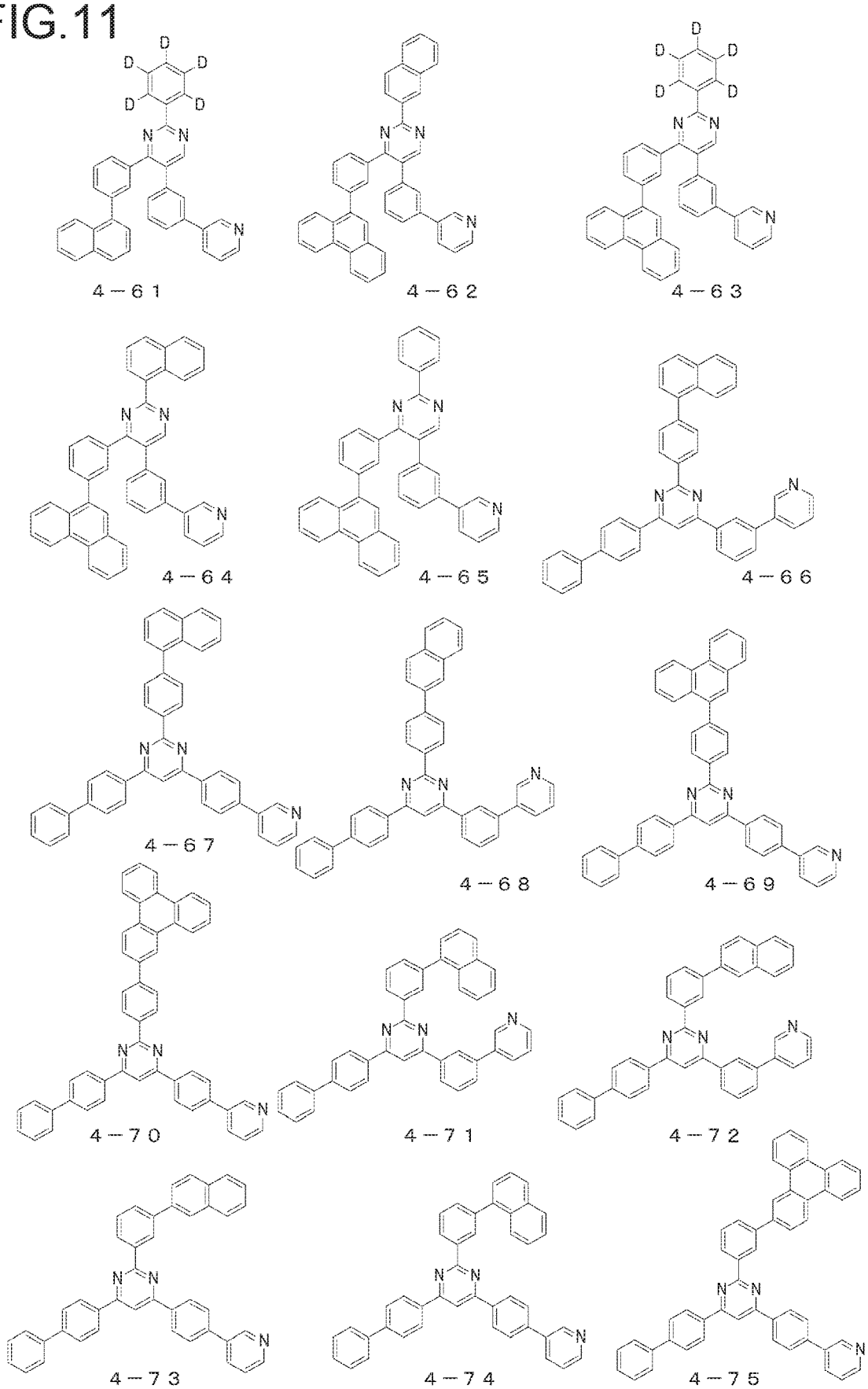
FIG. 11 is a diagram showing Compound 4-61 to Compound 4-75 that are pyrimidine ring compounds represented by the general formula (4) of the present invention.
Figure 12:
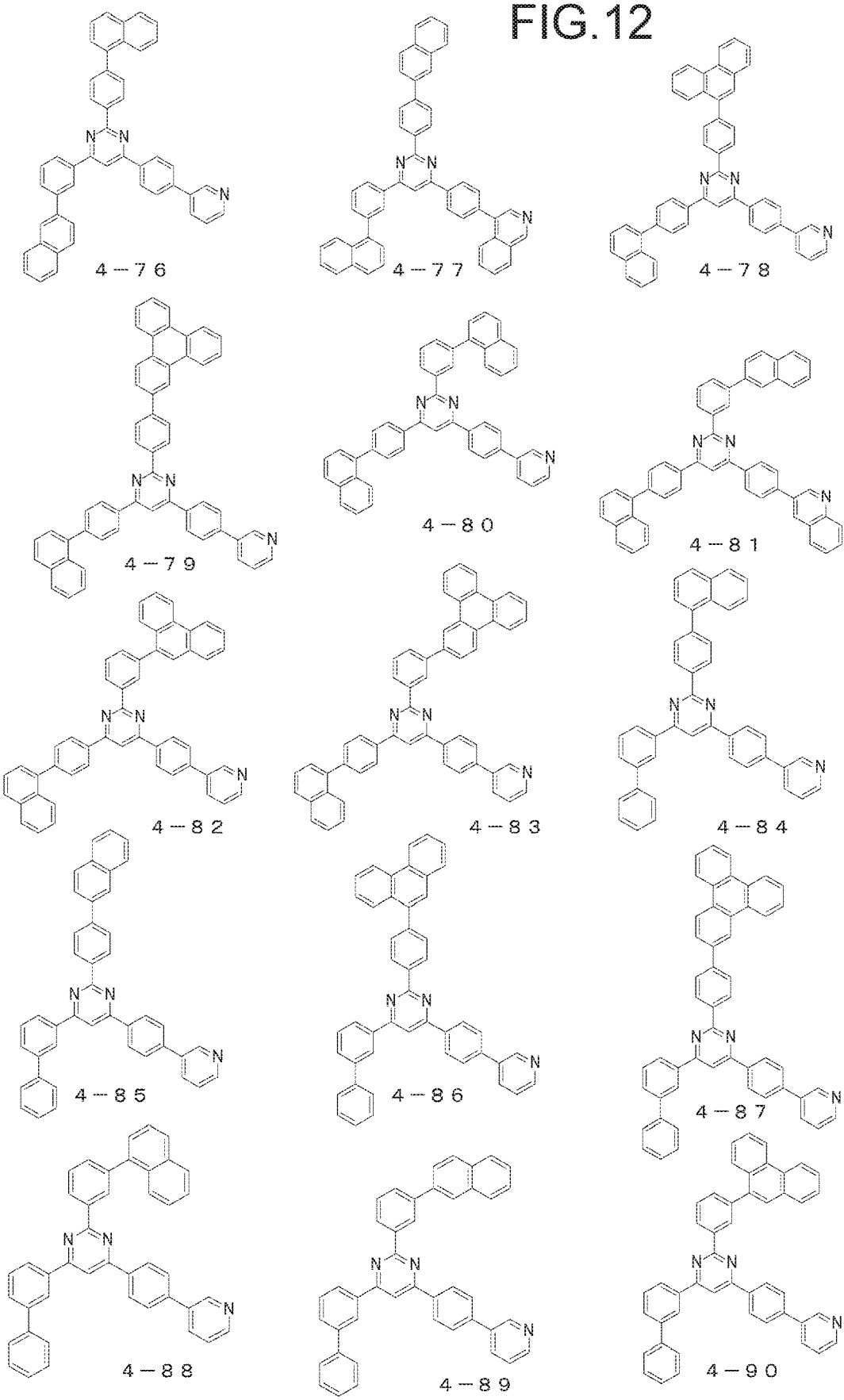
FIG. 12 is a diagram showing Compound 4-76 to Compound 4-90 that are pyrimidine ring compounds represented by the general formula (4) of the present invention.
Figure 13:
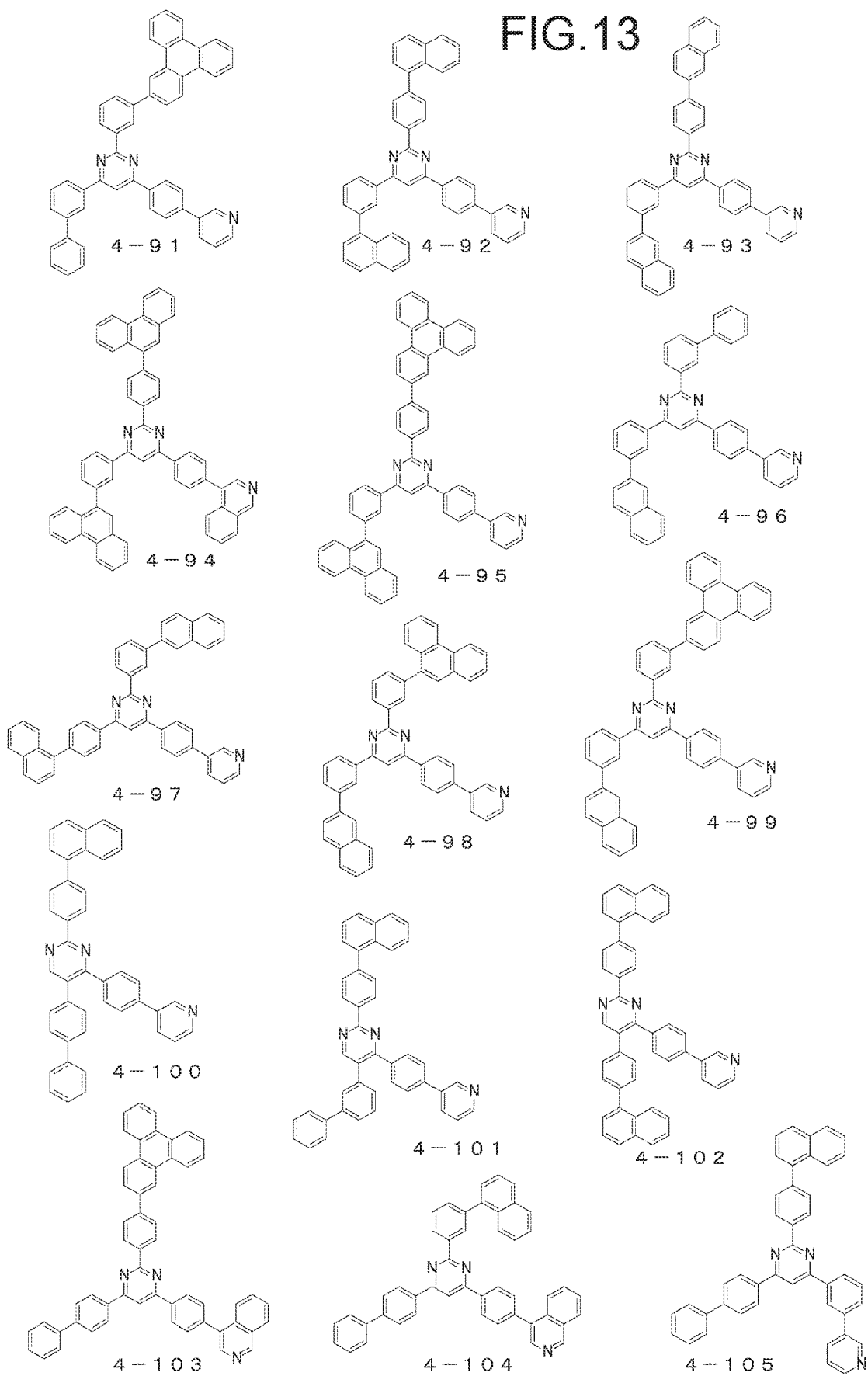
FIG. 13 is a diagram showing Compound 4-91 to Compound 4-105 that are pyrimidine ring compounds represented by the general formula (4) of the present invention.
Figure 14:
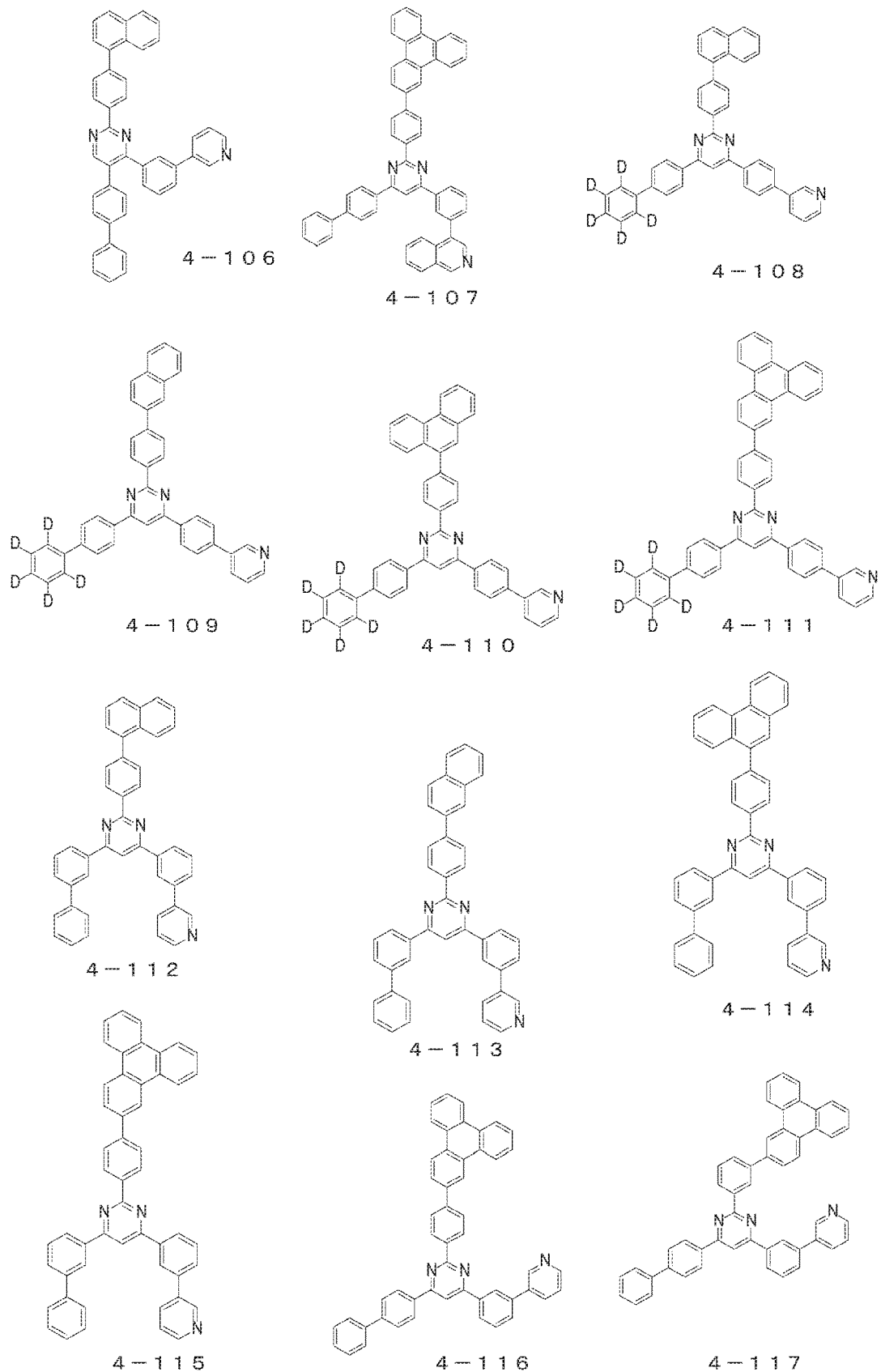
FIG. 14 is a diagram showing Compound 4-106 to Compound 4-117 that are pyrimidine ring compounds represented by the general formula (4) of the present invention.
Figure 15:
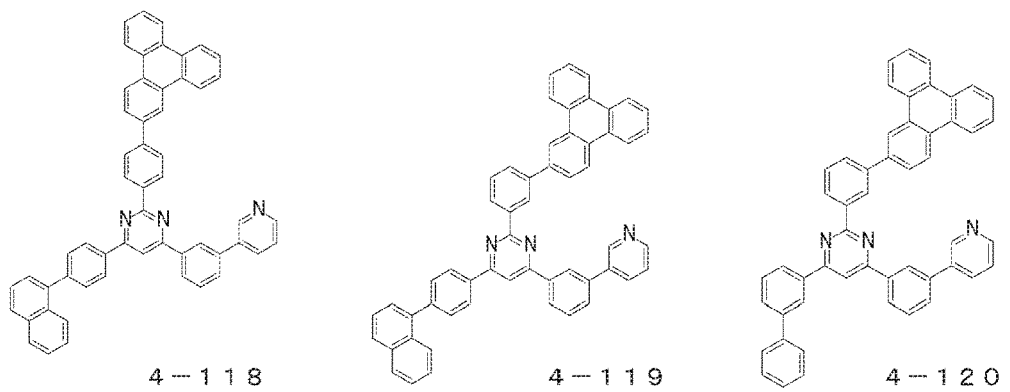
FIG. 15 is a diagram showing Compound 4-118 to Compound 4-126 that are pyrimidine ring compounds represented by the general formula (4) of the present invention.
Figure 15:
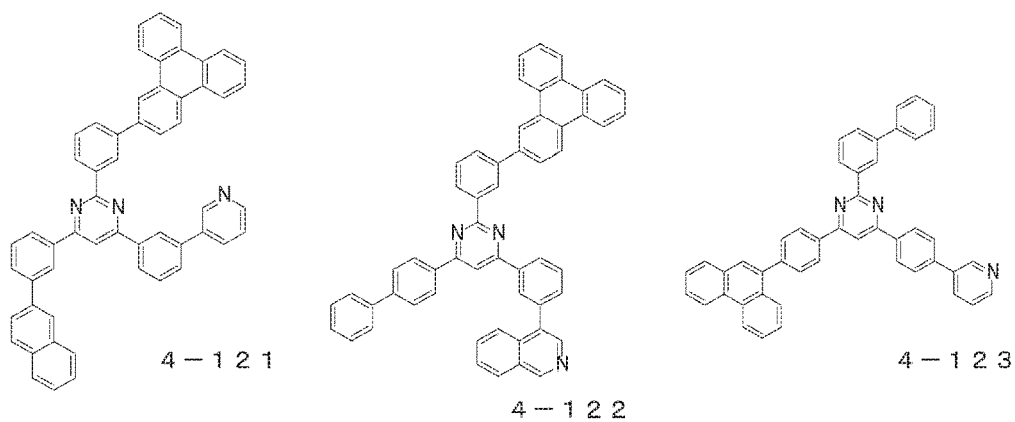
Figure 15:
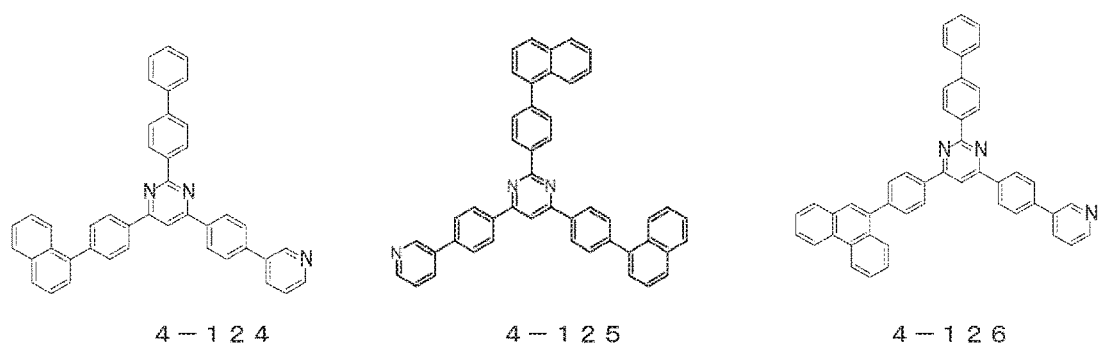

Compounds 4-1 to 4-126 are shown in FIGS. 7 and 15 as specific examples of favorable compounds among the pyrimidine ring compounds represented by the general formula (4), which are suitably used for the organic EL element according to the present invention. However, the present invention is not limited to these compounds.

Note that the above-mentioned compound having a pyrimidine ring structure can be synthesized in accordance with a method known per se (see, for example, Patent Literature 8).

Purification of compounds represented by the general formulae (1) and (1a) was carried out by purification by column chromatography, adsorption purification with silica gel, activated carbon, activated clay, or the like, recrystallization with a solvent, a crystallization method, or the like, and finally purification by sublimation purification or the like was performed. Identification of the compounds was performed by NMR analysis. As physical property values, a melting point, a glass transition point (Tg) and a work function were measured. The melting point is an index of a vapor deposition property. The glass transition point (Tg) is an index of stability in a thin film state. The work function is an index of a hole transport property.

In addition, regarding the compound used for the organic EL device according to the present invention, those purified by purification by column chromatography, adsorption purification with silica gel, activated carbon, activated clay, or the like, recrystallization with a solvent, a crystallization method, or the like, and finally purified by a sublimation purification method were used.

The melting point and the glass transition point (Tg) were measured with a powder using a high sensitivity differential scanning calorimeter (DSC3100SA manufactured by Bruker AXS GmbH).

The work function was obtained by preparing a thin film of 100 nm on an ITO substrate and using an ionization potential measuring apparatus (PYS-202 manufactured by Sumitomo Heavy Industries, Ltd.).

Examples of the structure of the organic EL device according to the present invention include those including an anode, a hole injection layer, a hole transport layer, a light-emitting layer, an electron transport layer, an electron injection layer, and a cathode in the stated order on a substrate, and those including a hole blocking layer between the light-emitting layer and the electron transport layer. In the multilayer structures, several organic layers can be omitted or combined. For example, the hole injection layer and the hole transport layer may be combined or the electron injection layer and the electron transport layer may be combined. Further, two or more organic layers having the same function can be stacked. For example, two hole transport layers may be stacked, two light-emitting layers may be stacked, or two electron transport layers may be stacked. As the structure of the organic EL device according to the present invention, a structure in which the hole transport layer has two stacked layers of a first hole transport layer and a second hole transport layer is also favorable. The second hole transport layer favorably has a function as an electron blocking layer.

For the anode of the organic EL device according to the present invention, an electrode material having a large work function such as ITO and gold is used.

As the hole transport layer of the organic EL device according to the present invention, a starburst type triphenylamine derivative, materials such as various triphenylamine tetramers; a porphyrin compound typified by copper phthalocyanine; an acceptor heterocyclic compound such as hexacyanoazatriphenylene, a coating type polymer material, or the like in addition to the arylamine compounds represented by the general formulae (1) and (1a) can be used. These materials may be deposited alone. However, any of the materials may be mixed with another material and used as a single deposited layer. Further, a stacked structure of layers deposited alone, layers mixed and deposited, or at least one layer deposited alone and at least one layer mixed and deposited may be achieved. These materials can be formed into a thin film by a known method such as a spin coat method and an ink jet method in addition to a vapor deposition method.

Further, in the hole injection layer or the hole transport layer, those obtained by P-doping a material typically used for the layer with trisbromophenylamine hexachloroantimony, a radialene derivative (see, for example, Patent Literature 6), or the like, a polymer compound having, as a partial structure, the structure of a benzidine derivative such as TPD, or the like can be used.

For the hole transport layer of the organic EL device according to the present invention, a benzidine derivative such as N,N'-diphenyl-N,N'-di(m-tolyl)benzidine (TPD), N,N'-diphenyl-N,N'-di(a-naphthyl)benzidine (NPD), and N,N,N',N'-tetrabiphenylylbenzidine, an arylamine compound having two triphenylamine structures in the molecule, each of which is bonded via a single bond or a divalent group containing no hetero atom, such as 1,1-bis[4-(di-4-tolylamino)phenyl]cyclohexane (TAPC), an arylamine compound having four triphenylamine structures in the molecule, each of which is bonded via a single bond or a divalent group containing no hetero atom, various triphenylamine trimers, or the like, in addition to the arylamine compounds represented by the general formulae (1) and (1a), can be used. These materials may be deposited alone. However, any of the materials may be mixed with another material and used as a single deposited layer. Further, a stacked structure of layers deposited alone, layers mixed and deposited, or at least one layer deposited alone and at least one layer mixed and deposited may be achieved. Further, for the hole injection/transport layer, a coating polymer material such as poly(3,4-ethylenedioxythiophene) (PEDOT)/poly (styrene sulfonate) (PSS) can be used. These materials can be formed into a thin film by a known method such as a spin coat method and an ink jet method in addition to a vapor deposition method.

For a second hole transport layer in the case where the hole transport layer has two stacked layers of a first hole transport layer and the second hole transport layer in the organic EL device according to the present invention, an arylamine compound having four triphenylamine structures in the molecule, each of which is bonded via a single bond or a divalent group containing no hetero atom, an arylamine compound having two triphenylamine structures in the molecule, each of which is bonded via a single bond or a divalent group containing no hetero atom, a compound having an electron blocking property, such as a carbazol derivative such as 4,4',4"-tri(N-carbazolyl) triphenylamine (TCTA), 9,9-bis[4-(carbazol-9-yl)phenyl]fluorene, 1,3-bis(carbazol-9-yl)benzene (mCP), and 2,2-bis(4-carbazol-9-ylphenyl)adamantane (Ad-Cz), and a compound having a triphenylsilyl group and a triarylamine structure typified by 9-[4-(carbazol-9-yl)phenyl]-9-[4-(triphenylsilyl)phenyl]-9H-fluorene, in addition to the arylamine compounds represented by the general formulae (1) and (1a), can be used. These materials may be deposited alone. However, any of the materials may be mixed with another material and used as a single deposited layer. Further, a stacked structure of layers deposited alone, layers mixed and deposited, or at least one layer deposited alone and at least one layer mixed and deposited may be achieved. These materials can be formed into a thin film by a known method such as a spin coat method and an ink jet method in addition to a vapor deposition method.

For the light-emitting layer of the organic EL device according to the present invention, various metal complexes such as a metal complex of a quinolinol derivative including Alq$_3$, an anthracene derivative, a bis-styryl benzene derivative, a pyrene derivative, an oxazole derivative, a polyparaphenylene vinylene derivative, or the like, in addition to the heterocyclic compound having a fused ring structure represented by the general formula (2) and the heterocyclic compound having a fused ring structure represented by the general formula (3), can be used. Further, the light-emitting layer may be formed of a host material and a dopant material. As the host material, in addition to the heterocyclic compound having a fused ring structure represented by the general formula (2) and the heterocyclic compound having a fused ring structure represented by the general formula (3), not only the above-mentioned light-emitting material but also a thiazole derivative, a benzimidazole derivative, a polydialkylfluorene derivative, and the like can be used. Further, as the dopant material, quinacridone, coumarin, rubrene, perylene, pyrene, and derivatives thereof, a benzopyran derivative, an indenophenanthrene derivative, a rhodamine derivative, an aminostyryl derivative, and the like can be used. These materials may be deposited alone. However, any of the materials may be mixed with another material and used as a single deposited layer. Further, a stacked structure of layers deposited alone, layers mixed and deposited, or at least one layer deposited alone and at least one layer mixed and deposited may be achieved.

For the light-emitting layer of the organic EL device according to the present invention, it is favorable to use the heterocyclic compound having a fused ring structure represented by the general formula (2) or the heterocyclic compound having a fused ring structure represented by the general formula (3) as a host material.

Further, as the light-emitting material, a phosphorescent material is favorably used. As the phosphorescent material, a phosphorescent material of a metal complex such as iridium and platinum can be used. A green phosphorescent material such as Ir(ppy)$_3$, a blue phosphorescent material such as FIrpic and FIr6, a red phosphorescent material such as Btp$_2$Ir (acac), or the like is used. As the host material (having a hole injection/transporting property) at this time, a carbazol derivative such as 4,4'-di(N-carbazolyl) biphenyl (CBP), TCTA, and mCP, in addition to the heterocyclic compound having a fused ring structure represented by the general formula (2) and the heterocyclic compound having a fused ring structure represented by the general formula (3), can be used. As a host material having an electron transportability, p-bis(triphenylsilyl)benzene (UGH2), 2,2',2"-(1,3,5-phenylene)-tris(1-phenyl-1H-benzimidazole) (TPBI), or the like can be used, and an organic EL device having high performance can be prepared.

In order to avoid concentration quenching, it is favorable to dope the host material with the phosphorescent material by co-deposition in the range of 1 to 30 weight percent with respect to the entire light-emitting layer.

Further, as the light-emitting material, a material emitting delayed fluorescence such as a CDCB derivative including PIC-TRZ, CC2TA, PXZ-TRZ, and 4CzIPN can be used (see, for example, Non-Patent Literature 3).

These materials can be formed into a thin film by a known method such as a spin coat method and an ink jet method in addition to a vapor deposition method.

For the hole blocking layer of the organic EL device according to the present invention, a compound having a hole blocking effect, such as various rare earth complexes, a triazole derivative, a triazine derivative, and an oxadiazole derivative, in addition to a phenanthroline derivative such as bathocuproin (BCP) and metal complex of a quinolinol derivative such as aluminum (III) bis (2-methyl-8-quinolinate)-4-phenylphenolate (BAlq), can be used. These materials may double as the material of the electron transport layer. These materials may be deposited alone. However, any of the materials may be mixed with another material and used as a single deposited layer. Further, a stacked structure of layers deposited alone, layers mixed and deposited, or at least one layer deposited alone and at least one layer mixed and deposited may be achieved. These materials can be formed into a thin film by a known method such as a spin coat method and an ink jet method in addition to a vapor deposition method.

For the electron transport layer of the organic EL device according to the present invention, a compound having a pyrimidine ring structure, which is represented by the general formula (4), is favorably used. These materials may be deposited alone. However, any of the materials may be mixed with another electron transport material and used as a single deposited layer. Further, a stacked structure of layers deposited alone, layers mixed and deposited, or at least one layer deposited alone and at least one layer mixed and deposited may be achieved. These materials can be formed into a thin film by a known method such as a spin coat method and an ink jet method in addition to a vapor deposition method.

As an electron transport material that can be mixed or simultaneously used with the compound having a pyrimidine ring structure represented by the general formula (4), a metal complex of a quinolinol derivative including Alq$_3$ and BAlq, various metal complexes, a triazole derivative, a triazine derivative, an oxadiazole derivative, a pyridine derivative, a pyrimidine derivative, a benzimidazole derivative, a thiadiazole derivative, an anthracene derivative, a carbodiimide derivative, a quinoxaline derivative, a pyridoindole derivative, a phenanthroline derivative, a silole derivative, or the like can be used.

For the electron injection layer of the organic EL device according to the present invention, an alkali metal salt such as lithium fluoride and cesium fluoride, an alkaline earth metal salt such as magnesium fluoride, a metal oxide such as an aluminum oxide, a metal such as ytterbium (Yb), samarium (Sm), calcium (Ca), strontium (Sr), and cesium (Cs), or the like can be used. However, this can be omitted in the favorable selection of the electron transport layer and the cathode.

In the cathode of the organic EL device according to the present invention, an electrode material having a low work function, such as aluminum, an alloy having a lower work function, such as a magnesium silver alloy, a magnesium indium alloy, and an aluminum magnesium alloy, or the like is used as the electrode material.

Hereinafter, the embodiment of the present invention will be specifically described by way of Examples. However, the present invention is not limited to the following Examples.

EXAMPLE 1

Synthesis of 4-{(9,9-dimethylfluoren-2-yl)-(biphenyl-4-yl)amino}-4'-(biphenyl-4-yl-phenylamino)-2-phenyl-biphenyl (Compound 1-7)

(9,9-dimethylfluoren-2-yl)-(biphenyl-4-yl)-(6-brombiphenyl-3-yl)amine: 10.0 g, 4-{(biphenyl-4-yl)-phenylamino} phenylboronic acid: 7.9 g, tetrakistriphenylphosphine palladium (0): 0.60 g, potassium carbonate: 5.0 g, toluene: 80 ml, ethanol: 40 ml, and water: 30 ml were added to a reaction vessel purged with nitrogen, and the mixture was heated and stirred at 100° C. overnight. After the mixture was cooled, an organic layer was extracted by liquid separation and then the extract was concentrated and purified by column chromatography (carrier: silica gel, eluent: dichloromethane/heptane). Thus, a white powder of 4-{(9,9-dimethylfluoren-2-yl)-(biphenyl-4-yl)amino}-4'-(biphenyl-4-yl-phenylamino)-2-phenyl-biphenyl (Compound 1-7): 8.30 g (yield of 49%) was obtained.

The structure of the obtained white powder was identified using NMR.

The following 48 hydrogen signals were detected by $^1$H-NMR (CDCl$_3$).

δ (ppm)=7.72-7.60 (2H), 7.59-7.52 (2H), 7.51-7.10 (35), 7.09-6.90 (3H), 1.56 (6H).

(Chem. 18)

(1-7)

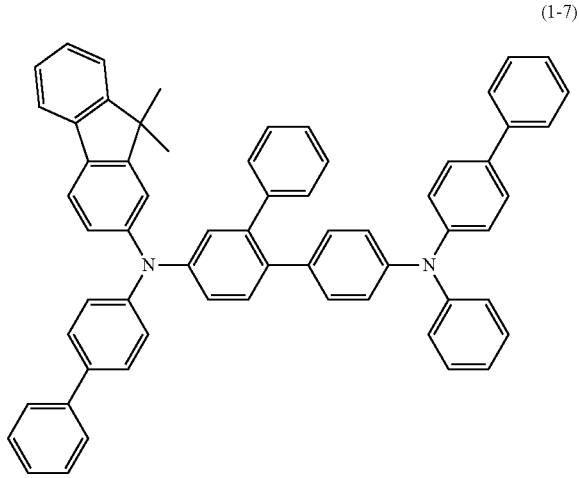

EXAMPLE 2

Synthesis of 4-{(9,9-dimethylfluoren-2-yl)-(biphenyl-4-yl)amino}-4'-(diphenylamino)-2-phenyl-biphenyl (Compound 1-11)

By using 4-(diphenylamino) phenylboronic acid instead of 4-{(biphenyl-4-yl)-phenylamino}phenylboronic acid in Example 1 and performing the reaction under similar conditions, a white powder of 4-{(9,9-dimethylfluoren-2-yl)-(biphenyl-4-yl)amino}-4'-(diphenylamino)-2-phenyl-biphenyl (Compound 1-11): 11.5 g (yield of 75%) was obtained.

The structure of the obtained white powder was identified using NMR.

The following 44 hydrogen signals were detected by $^1$H-NMR (CDCl$_3$).

δ (ppm)=7.71-7.64 (4H), 7.58-7.56 (2H), 7.49-6.94 (32), 1.51 (6H).

(Chem. 19)

(1-11)

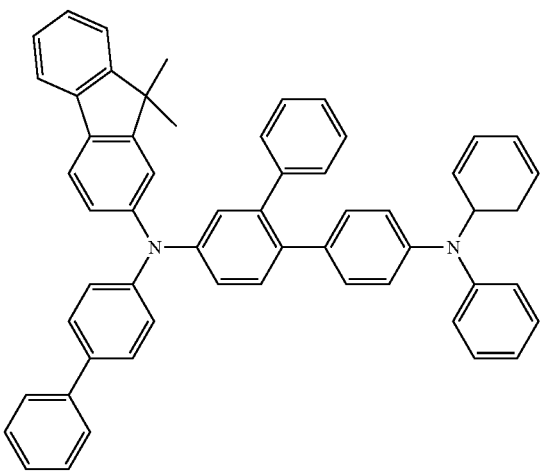

EXAMPLE 3

Synthesis of 4-{(9,9-dimethylfluoren-2-yl)-phenylamino}-4'-(biphenyl-4-yl-phenylamino)-2-phenyl-biphenyl (Compound 1-14)

By using (9,9-dimethylfluoren-2-yl)-phenyl-(6-brombiphenyl-3-yl) amine instead of (9,9-dimethylfluoren-2-yl)-(biphenyl-4-yl)-(6-brombiphenyl-3-yl) amine in Example 1 and performing the reaction under similar conditions, a white powder of 4-{(9,9-dimethylfluoren-2-yl)-phenylamino}-4'-(biphenyl-4-yl-phenylamino)-2-phenyl-biphenyl (Compound 1-14): 10.2 g (yield of 69%) was obtained.

The structure of the obtained white powder was identified using NMR.

The following 44 hydrogen signals were detected by $^1$H-NMR (CDCl$_3$).

δ (ppm)=7.69-7.59 (4H), 7.48-7.42 (4H), 7.37-6.98 (30), 1.49 (6H).

(Chem. 20)

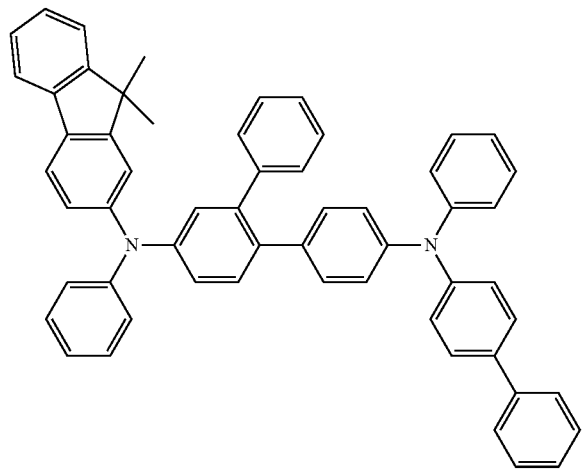

(1-14)

EXAMPLE 4

The melting point and the glass transition point of the arylamine compound represented by the general formula (1) were measured using a high sensitivity differential scanning calorimeter (DSC3100SA manufactured by Bruker AXS GmbH).

| Melting point | Glass transition point |
|---|---|
| Compound of Example 1 | Not observed 125° C. |
| Compound of Example 2 | Not observed 117° C. |
| Compound of Example 3 | Not observed 114° C. |

The arylamine compound represented by the general formula (1) has the glass transition point of 100° C. or more, which indicates that it is stable in a thin film state.

EXAMPLE 5

The arylamine compound represented by the general formula (1) was used to prepare a vapor deposition film having a film thickness of 100 nm on an ITO substrate, and the work function thereof was measured by an ionization potential measuring apparatus (PYS-202 manufactured by Sumitomo Heavy Industries, Ltd.).

| Work Function | |
|---|---|
| Compound of Example 1 | 5.57 eV |
| Compound of Example 2 | 5.62 eV |
| Compound of Example 3 | 5.59 eV |

It can be seen that the arylamine compound represented by the general formula (1) has favorable hole transport performance because it has a more favorable energy level than the work function that a general hole transport material such as NPD and TPD has, which is 5.4 eV.

EXAMPLE 6

Synthesis of 7,7-dimethyl-12-(4-phenylbenzo[h] quinazolin-2-yl)-7,12-dihydrobenzo[4,5]thieno[3,2-g]indeno[1,2-b]indole (Compound 2-2)

7,7-dimethyl-7,12-dihydrobenzo[4,5]thieno[3,2-g]indeno[1,2-b]indole: 4.9 g, 2-chloro-4-phenylbenzo[h]quinazolin: 5.7 g, tris(dibenzylideneacetone) dipalladium: 0.3 g, tri-tert-butylphosphonium tetrafluoroborate: 0.4 g, sodium tert-butoxide: 4.0 g, and xylene: 74 ml were added to a reaction vessel purged with nitrogen, and the mixture was heated and stirred under reflux for 12 hours. After the mixture was cooled, ethyl acetate and water are added thereto and then an organic layer was extracted by liquid separation. The organic layer was concentrated and purified by column chromatography. Thus, a powder of 7,7-dimethyl-12-(4-phenylbenzo[h]quinazolin-2-yl)-7,12-dihydrobenzo[4,5]thieno[3,2-g]indeno[1,2-b]indole (Compound 2-2): 3.2 g (yield of 38%) was obtained.

(Chem. 21)

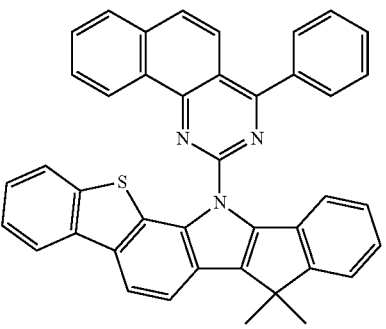

(2-2)

EXAMPLE 7

<Synthesis of 12,12-dimethyl-1-(4-phenylquinazoline-2-yl)-1,12-dihydroindeno[1',2':4,5]thieno[2,3-a]carbazole (Compound 3-14)

12,12-dimethyl-1,12-dihydroindeno[1',2':4,5]thieno[2,3-a]carbazole 4.9 g, 2-chloro-4-phenylquinazoline: 5.7 g, tris(dibenzylideneacetone) dipalladium: 0.3 g, tri-tert-butylphosphonium tetrafluoroborate: 0.4 g, sodium tert-butoxide: 4.0 g, and xylene: 74 ml were added to a reaction vessel purged with nitrogen, and the mixture was heated and stirred under reflux for 12 hours. After the mixture was cooled, ethyl acetate and water are added thereto and then an organic layer was extracted by liquid separation. The organic layer was concentrated and purified by column chromatography. Thus, a powder of, 12,12-dimethyl-1-(4-phenylquinazoline-2-yl)-1,12-dihydroindeno[1',2':4,5]thieno[2,3-a]carbazole (Compound 3-14): 6.3 g (yield of 44%) was obtained.

(Chem. 22)

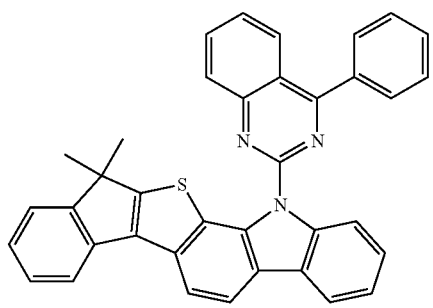

(3-14)

EXAMPLE 8

Figure 16:
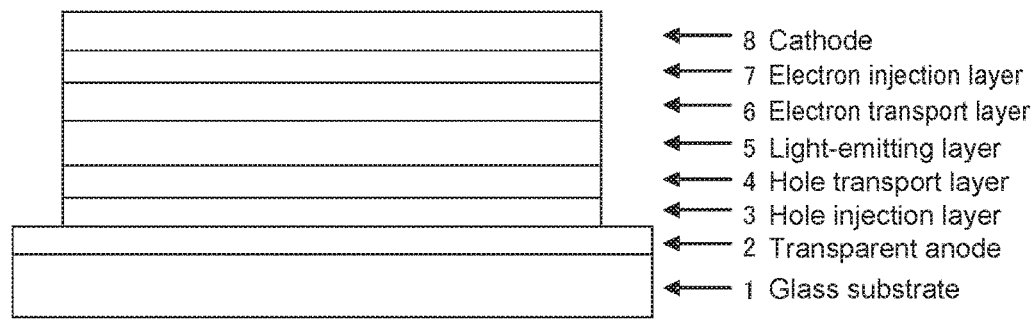
FIG. 16 is a diagram showing a configuration of organic EL devices according to Examples 8 to 13 and Comparative Examples 1 to 4.

The organic EL device was prepared by depositing a hole injection layer 3, the hole transport layer 4, the light-emitting layer 5, an electron transport layer 6, an electron injection layer 7, and a cathode (aluminum electrode) 8 in the stated order on a transparent anode 2, which has been formed on a glass substrate 1 as an ITO electrode in advance, as shown in FIG. 16.

Specifically, after performing, in isopropyl alcohol for 20 minutes, ultrasonic cleaning on the glass substrate 1 on which ITO having a film thickness of 150 nm was formed, the glass substrate 1 was dried for 10 minutes on a hot plate heated to 200° C. After that, UV ozone treatment was performed for 15 minutes, and then, the ITO-attached glass substrate was mounted in a vacuum deposition machine. The pressure in the vacuum deposition machine was reduced to 0.001 Pa or less. Subsequently, a film of an electron acceptor (Acceptor-1) having the following structural formula and the Compound (1-7) according to Example 1 was formed, as the hole injection layer 3, to have a film thickness of 10 nm and cover the transparent anode 2 by binary deposition at a deposition rate in which the ratio of the deposition rates of (Acceptor-1) and the Compound (1-7) was 3:97. As the hole transport layer 4, a film of the Compound (1-7) according to the Example 1 was formed on the hole injection layer 3 to have a film thickness of 50 nm. A film of a Compound (EMD-1) having the following structural formula and the Compound (2-2) according to Example 10 was formed, as the light-emitting layer 5, on the hole transport layer 4 to have a film thickness of 20 nm by binary deposition at a deposition rate in which the ratio of the deposition rates of (EMD-1) and (2-2) was 5:95. A film of the Compound (4-125) having a pyridine ring structure and the following structural formula and a Compound (ETM-1) having the following structural formula was formed on the light-emitting layer 5, as the electron transport layer 6 to have a film thickness of 30 nm by binary deposition at a deposition rate in which the ratio of the deposition rates of the Compound (4-125) having a pyridine ring structure and the Compound (ETM-1) was 50:50. A film of lithium fluoride was formed, as the electron injection layer 7, on the electron transport layer 6 to have a film thickness of 1 nm. Finally, aluminum was deposited to have a thickness of 100 nm to form the cathode 8. The characteristics of the prepared organic EL device were measured at room temperature in the atmosphere. The measurement results of the light-emitting characteristics when a direct current voltage was applied to the prepared organic EL device were collectively shown in Table 1.

(Chem. 23)

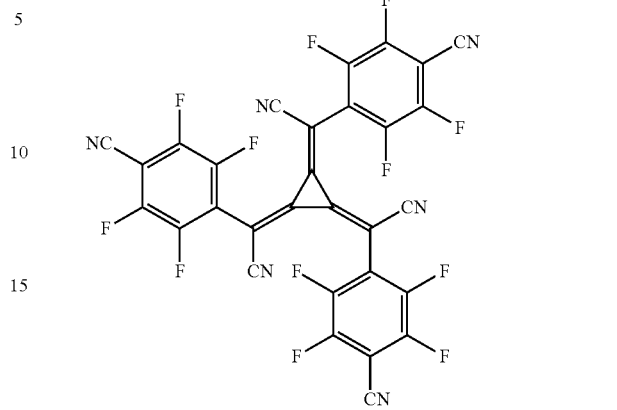

(Acceptor-1)

(Chem. 24)

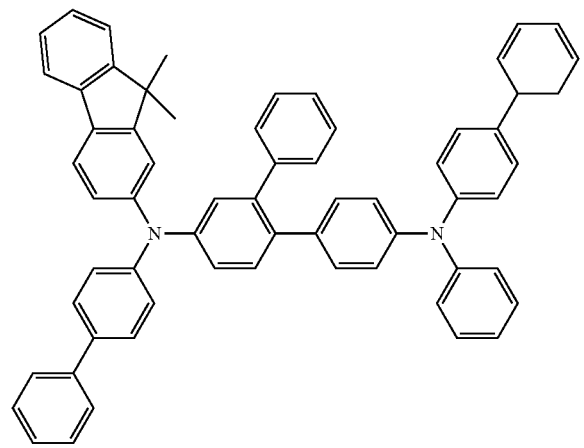

(1-7)

(Chem. 25)

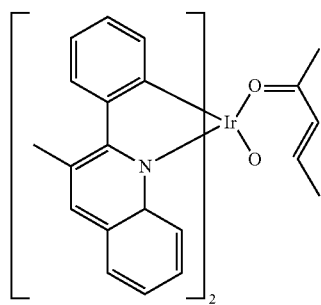

(EMD-1)

(Chem. 26)

(2-2)

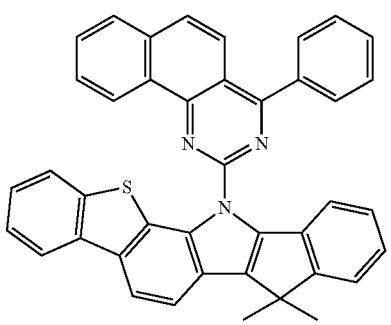

(Chem. 27)

(4-125)

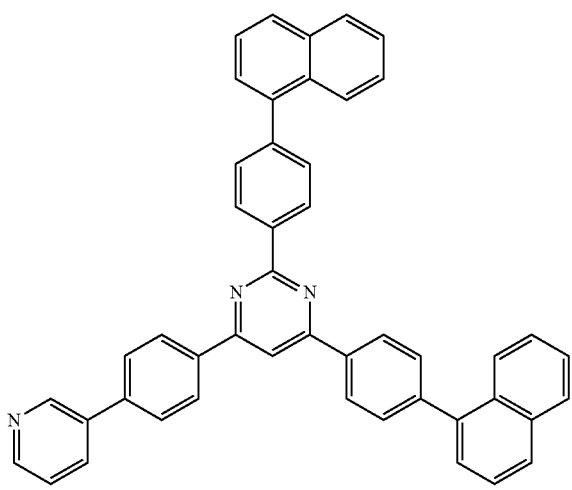

(Chem. 28)

(ETM-1)

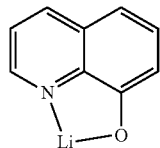

EXAMPLE 9

An organic EL device was prepared in similar conditions to Example 8 except that the Compound (1-11) according to Example 2 was used for the material of the hole injection layer 3 and the hole transport layer 4 instead of the Compound (1-7) according to Example 1. The characteristics of the prepared organic EL device were measured at room temperature in the atmosphere. The measurement results of the light-emitting characteristics when a direct current voltage was applied to the prepared organic EL device were collectively shown in Table 1.

(Chem. 29)

(1-11)

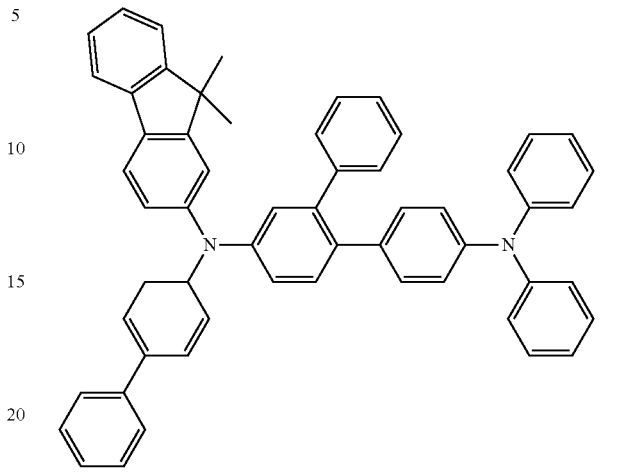

EXAMPLE 10

An organic EL device was prepared in similar conditions to Example 8 except that the Compound (1-14) according to Example 3 was used for the material of the hole injection layer 3 and the hole transport layer 4 instead of the Compound (1-7) according to Example 1. The characteristics of the prepared organic EL device were measured at room temperature in the atmosphere. The measurement results of the light-emitting characteristics when a direct current voltage was applied to the prepared organic EL device were collectively shown in Table 1.

(Chem. 30)

(1-14)

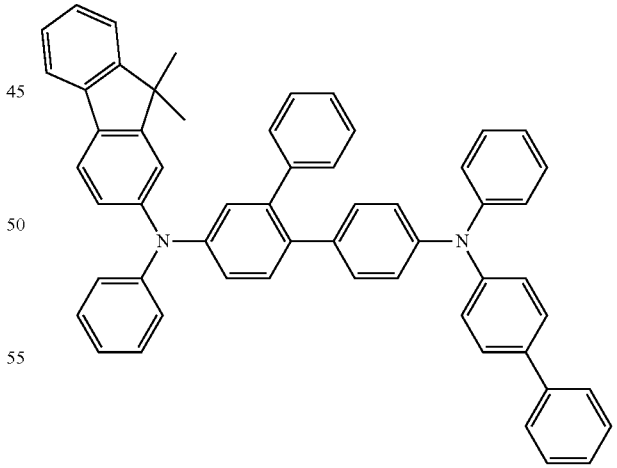

EXAMPLE 11

An organic EL device was prepared in similar conditions to Example 8 except that the Compound (3-14) according to Example 7 was formed as the material of the light-emitting layer 5 instead of the Compound (2-2) according to Example 6 to have a film thickness of 20 nm by binary deposition at a deposition rate in which the ratio of the deposition rates of (EMD-1):(3-14) was 5:95. The characteristics of the prepared organic EL device were measured at room temperature in the atmosphere. The measurement results of the light-emitting characteristics when a direct current voltage was applied to the prepared organic EL device were collectively shown in Table 1.

(Chem. 31)

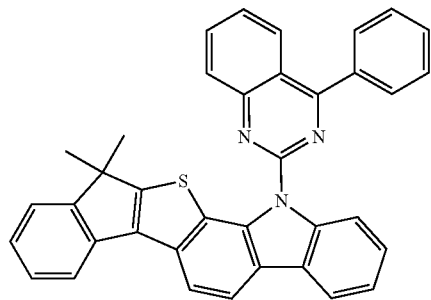

(3-14)

EXAMPLE 12

An organic EL device was prepared in similar conditions to Example 8 except that the Compound (1-11) according to Example 2 was used for the material of the hole injection layer 3 and the hole transport layer 4 instead of the Compound (1-7) according to Example 1 and a film of the Compound (3-14) according to Example 7 was formed as the material of the light-emitting layer 5 instead of the Compound (2-2) according to Example 6 to have a film thickness of 20 nm by binary deposition at a deposition rate in which the ratio of the deposition rates of (EMD-1):(3-14) was 5:95. The characteristics of the prepared organic EL device were measured at room temperature in the atmosphere. The measurement results of the light-emitting characteristics when a direct current voltage was applied to the prepared organic EL device were collectively shown in Table 1.

EXAMPLE 13

An organic EL device was prepared in similar conditions to Example 8 except that the Compound (1-14) according to Example 3 was used for the material of the hole injection layer 3 and the hole transport layer 4 instead of the Compound (1-7) according to Example 1 and a film of the Compound (3-14) according to Example 7 was formed as the material of the light-emitting layer 5 instead of the Compound (2-2) according to Example 6 to have a film thickness of 20 nm by binary deposition at a deposition rate in which the ratio of the deposition rates of (EMD-1):(3-14) was 5:95. The characteristics of the prepared organic EL device were measured at room temperature in the atmosphere. The measurement results of the light-emitting characteristics when a direct current voltage was applied to the prepared organic EL device were collectively shown in Table 1.

COMPARATIVE EXAMPLE 1

For comparison, an organic EL device was prepared in similar conditions to Example 8 except that the Compound (HTM-1) having the following structure was used for the material of the hole injection layer 3 and the hole transport layer 4 instead of the Compound (1-7) according to Example 1. The characteristics of the prepared organic EL device were measured at room temperature in the atmosphere. The measurement results of the light-emitting characteristics when a direct current voltage was applied to the prepared organic EL device were collectively shown in Table 1.

(Chem. 32)

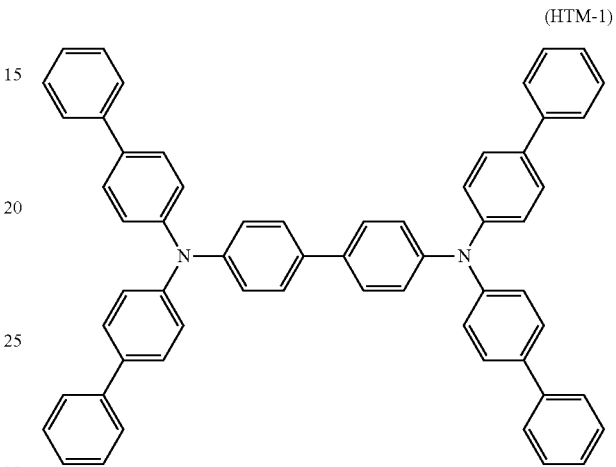

(HTM-1)

COMPARATIVE EXAMPLE 2

For comparison, an organic EL device was prepared in similar conditions to Example 8 except that the Compound (HTM-1) having the following structure was used for the material of the hole injection layer 3 and the hole transport layer 4 instead of the Compound (1-7) according to Example 1 and a film of the Compound (3-14) according to Example 7 was formed as the material of the light-emitting layer 5 instead of the Compound (2-2) according to Example 6 to have a film thickness of 20 nm by binary deposition at a deposition rate in which the ratio of the deposition rates of (EMD-1):(3-14) was 5:95. The characteristics of the prepared organic EL device were measured at room temperature in the atmosphere. The measurement results of the light-emitting characteristics when a direct current voltage was applied to the prepared organic EL device were collectively shown in Table 1.

COMPARATIVE EXAMPLE 3

For comparison, an organic EL device was prepared in similar conditions to Example 8 except that the Compound (HTM-2) having the following structural formula was used for the material of the hole injection layer 3 and the hole transport layer 4 instead of the Compound (1-7) according to Example 1. The characteristics of the prepared organic EL device were measured at room temperature in the atmosphere. The measurement results of the light-emitting characteristics when a direct current voltage was applied to the prepared organic EL device were collectively shown in Table 1.

[Chem. 33]

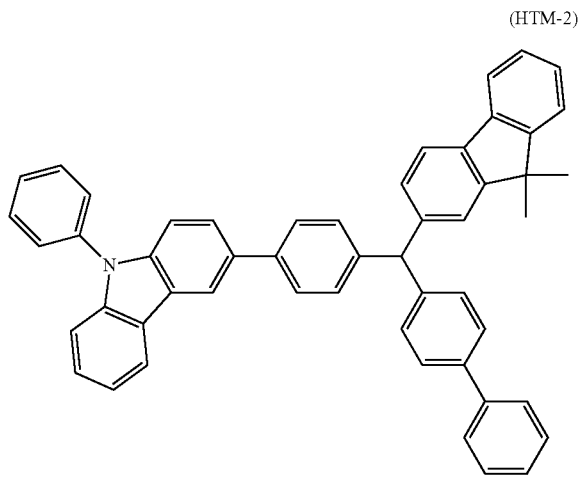

(HTM-2)

COMPARATIVE EXAMPLE 4

For comparison, an organic EL device was prepared in similar conditions to Example 8 except that the Compound (HTM-2) having the following structural formula was used for the material of the hole injection layer 3 and the hole transport layer 4 instead of the Compound (1-7) according to Example 1 and a film of the Compound (3-14) according to Example 7 was formed for the material of the light-emitting layer 5 instead of the Compound (2-2) according to Example 6 to have a film thickness of 20 nm by binary deposition at a deposition rate in which the ratio of the deposition rates of (EMD-1):(3-14) was 5:95. The characteristics of the prepared organic EL device were measured at room temperature in the atmosphere. The measurement results of the light-emitting characteristics when a direct current voltage was applied to the prepared organic EL device were collectively shown in Table 1.

The device lifetime was measured using each of the organic EL devices prepared in Examples 8 to 13 and Comparative Examples 1 to 4, and the results were collectively shown in Table 1. The device lifetime was measured as the time until the light emission luminance attenuated to 6790 $cd/m^2$ (corresponding to 97% in the case where the initial luminance was 100%: 97% attenuation) when constant current driving was performed with the light emission luminance (initial luminance) at the start of light emission set to 7000 $cd/m^2$.

TABLE 1

| | Hole transport layer | Light-emitting layer | Electron transport layer | Voltage [V] (@10 mA/cm2) | Luminance [cd/m2] (@10 mA/cm2) | Light emission efficiency [cd/A] (@10 mA/cm2) | Power efficiency [cd/A] (@10 mA/cm2) | Element lifetime 95% attenuated |
|---|---|---|---|---|---|---|---|---|
| Example 8 | Compound 1-7 | EMD-1/ Compound 2-2 | Compound 4-125/ETM-1 | 3.93 | 2728 | 27.32 | 21.88 | 226 hours |
| Example 9 | Compound 1-11 | EMD-1/ Compound 2-2 | Compound 4-125/ETM-1 | 3.95 | 2717 | 27.20 | 21.62 | 237 hours |
| Example 10 | Compound 1-14 | EMD-1/ Compound 2-2 | Compound 4-125/ETM-1 | 3.92 | 2726 | 27.31 | 21.91 | 224 hours |
| Example 11 | Compound 1-7 | EMD-1/ Compound 3-14 | Compound 4-125/ETM-1 | 3.97 | 2797 | 27.99 | 22.14 | 262 hours |
| Example 12 | Compound 1-11 | EMD-1/ Compound 3-14 | Compound 4-125/ETM-1 | 4.02 | 2773 | 27.75 | 21.67 | 298 hours |
| Example 13 | Compound 1-14 | EMD-1/ Compound 3-14 | Compound 4-125/ETM-1 | 3.98 | 2799 | 26.00 | 22.10 | 262 hours |
| Comparative Example 1 | HTM-1 | EMD-1/ Compound 2-2 | Compound 4-125/ETM-1 | 4.08 | 2574 | 25.77 | 19.84 | 154 hours |
| Comparative Example 2 | HTM-1 | EMD-1/ Compound 3-14 | Compound 4-125/ETM-1 | 4.15 | 2569 | 25.71 | 19.46 | 173 hours |
| Comparative Example 3 | HTM-2 | EMD-1/ Compound 2-2 | Compound 4-125/ETM-1 | 4.27 | 2453 | 24.58 | 18.09 | 113 hours |
| Comparative Example 4 | HTM-2 | EMD-1/ Compound 3-14 | Compound 4-125/ETM-1 | 4.27 | 2374 | 23.80 | 17.33 | 117 hours |

As shown in Table 1, in comparison between Examples 8 to 10 and Comparative Examples 1 and 3 in which the materials of the light-emitting layer are in the same combination, the light emission efficiency when a current having a current density of 10 mA/cm² was caused to flow was high, i.e., 27.20 to 27.32 cd/A in the organic EL devices according to Examples 8 to 10 as compared with 24.58 to 25.77 cd/A of the organic EL devices according to Comparative Examples 1 and 3. Further, also the power efficiency of the organic EL devices according to Examples 8 to 10 was high, i.e., 21.62 to 21.911 m/W as compared with 18.09 to 19.84 lm/W of the organic EL devices according to Comparative Examples 1 and 3. Meanwhile, it can be seen that the device lifetime (97% attenuation) was largely extended to 224 to 237 hours in the organic EL devices according to Examples 8 to 10 as compared with 113 to 154 hours of the organic EL devices according to Comparative Examples 1 and 3.

As shown in Table 1, in comparison between Examples 11 to 13 and Comparative Examples 2 and 4 in which the materials of the light-emitting layer are in the same combination, the light emission efficiency when a current having a current density of 10 mA/cm² was caused to flow was high in any of the organic EL devices according to Examples 11 to 13, i.e., 27.75 to 28.00 cd/A, as compared with those of the organic EL devices according to Comparative Examples 2 and 4, i.e., 23.80 to 25.71 cd/A. Further, also the power efficiency was high in any of the organic EL devices according to Examples 11 to 13, i.e., 21.67 to 22.14 lm/W, as compared with those of the organic EL devices according to Comparative Examples 2 and 4, i.e., 17.53 to 19.46 lm/W. Meanwhile, it can be seen that the device lifetime (97% attenuation) was largely extended to 262 to 298 hours in the organic EL devices according to Examples 11 to 13 as compared with 117 to 173 hours of the organic EL devices according to Comparative Examples 2 and 4.

It has been found that the organic EL device according to the present invention is capable of realizing an organic EL device that has higher light emission efficiency and a longer lifetime than the existing organic EL device because the carrier balance inside the organic EL device is improved by combining an arylamine compound having a specific structure and a specific heterocyclic compound having a fused ring structure (and a specific compound having an anthracene ring structure) and the combination is made so that the carrier balance matches the characteristics of the light-emitting material.

INDUSTRIAL APPLICABILITY

The organic EL device according to the present invention, which is obtained by combining a specific arylamine compound and a specific heterocyclic compound having a fused ring structure is capable of improving the light emission efficiency and the durability of the organic EL device. For example, it has become possible to expand to home appliances and lighting applications.

REFERENCE SIGNS LIST 1 glass substrate
2 transparent anode
3 hole injection layer
4 hole transport layer
5 light-emitting layer
6 electron transport layer
7 electron injection layer
8 cathode

The invention claimed is:
1. An organic electroluminescence device, comprising at least an anode, a hole transport layer which consists of a single layer, a light-emitting layer, an electron transport layer, and a cathode in the stated order, wherein
the hole transport layer contains an arylamine compound represented by the following general formula (1), and
the light-emitting layer contains a heterocyclic compound having a fused ring structure represented by the following general formula (2) or a heterocyclic compound having a fused ring structure represented following general formula (3)

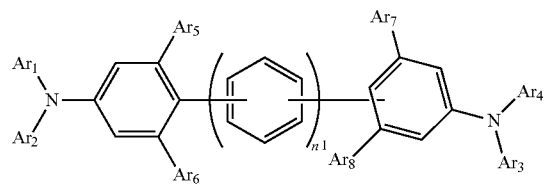

(1)

in the formula (1), $Ar_1$ to $Ar_5$ are the same or different from each other, and represents a substituted or unsubstituted aromatic hydrocarbon group, a substituted or unsubstituted aromatic heterocyclic group, or a substituted or unsubstituted fused polycyclic aromatic group, $Ar_6$ to $Ar_8$ represents a hydrogen atom, n1 represents 0, 1, or 2, and in formula (1), $Ar_3$ and $Ar_4$ form a ring with a single bond or are bonded to each other via a substituted or unsubstituted methylene group, an oxygen atom, or a sulfur atom to form a ring, or $Ar_3$ or $Ar_4$ form a ring with a benzene ring to which an $Ar_3Ar_4$—N group is bonded, with a single bond or are bonded to each other via a substituted or unsubstituted methylene group, an oxygen atom, or a sulfur atom to form a ring,

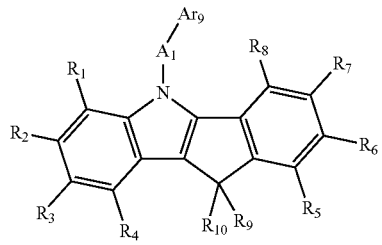

(2)

in the formula (2), $A_1$ represents a substituted or unsubstituted aromatic hydrocarbon divalent group, a substituted or unsubstituted aromatic heterocyclic divalent group, a substituted or unsubstituted fused polycyclic aromatic divalent group, or a single bond, $Ar_9$ represents a substituted or unsubstituted aromatic hydrocarbon group, a substituted or unsubstituted aromatic heterocyclic group, or a substituted or unsubstituted fused polycyclic aromatic group, $R_1$ to $R_4$ are the same or different from each other, and represents a hydrogen atom, a deuterium atom, a fluorine atom, a chlorine atom, a cyano group, a nitro group, an optionally substituted linear or branched alkyl group having 1 to 6 carbon atoms, an optionally substituted cycloalkyl group having 5 to 10 atoms, an optionally substituted linear or branched alkenyl group having 2 to 6 atoms, an optionally substituted linear or branched alkyloxy group having 1 to 6 carbon atoms, an optionally substituted cycloalkyloxy group having 5 to 10 carbon atoms, a substituted or unsubstituted aromatic hydrocarbon group, a substituted or unsubstituted aromatic heterocyclic group, a substituted or unsubstituted fused polycyclic aromatic group, a substituted or unsubstituted aryloxy group, or a disubstituted amino group substituted with a group selected from the group consisting of an aromatic hydrocarbon group, an aromatic heterocyclic group, and a fused polycyclic aromatic group, the groups of $R_1$ to $R_4$ form a ring with a single bond or are bonded to each other via a substituted or unsubstituted methylene group, an oxygen atom, or a sulfur atom to form a ring, or $R_1$ to $R_4$ and a benzene ring to which $R_1$ to $R_4$ are bonded to each other via a linking group selected from a substituted or unsubstituted methylene group, an oxygen atom, a sulfur atom, and a monoarylamino group to form a ring, $R_5$ to $R_8$ are the same or different from each other, and represents a hydrogen atom, a deuterium atom, a fluorine atom, a chlorine atom, a cyano group, a nitro group, an optionally substituted linear or branched alkyl group having 1 to 6 carbon atoms, an optionally substituted cycloalkyl group having 5 to 10 atoms, an optionally substituted linear or branched alkenyl group having 2 to 6 atoms, an optionally substituted linear or branched alkyloxy group having 1 to 6 carbon atoms, an optionally substituted cycloalkyloxy group having 5 to 10 carbon atoms, a substituted or unsubstituted aromatic hydrocarbon group, a substituted or unsubstituted aromatic heterocyclic group, a substituted or unsubstituted fused polycyclic aromatic group, a substituted or unsubstituted aryloxy group, or a disubstituted amino group substituted with a group selected from the group consisting of an aromatic hydrocarbon group, an aromatic heterocyclic group, and a fused polycyclic aromatic group, the groups of $R_5$ to $R_8$ form a ring with a single bond or are bonded to each other via a substituted or unsubstituted methylene group, an oxygen atom, or a sulfur atom to form a ring, or $R_5$ to $R_8$ and a benzene ring to which $R_5$ to $R_8$ are bonded to each other via a linking group such as a substituted or unsubstituted methylene group, an oxygen atom, a sulfur atom, and a monoarylamino group to form a ring, $R_9$ and $R_{10}$ are the same or different from each other, and represents an optionally substituted linear or branched alkyl group having 1 to 6 carbon atoms, a substituted or unsubstituted aromatic hydrocarbon group, a substituted or unsubstituted aromatic heterocyclic group, or a substituted or unsubstituted fused polycyclic aromatic group, or the groups of $R_9$ and $R_{10}$ form a ring with a single bond or are bonded to each other via a substituted or unsubstituted methylene group, an oxygen atom, or a sulfur atom to form a ring,

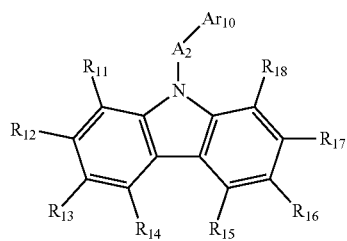

(3)

in the formula (3), $A_2$ represents a substituted or unsubstituted aromatic hydrocarbon divalent group, a substituted or unsubstituted aromatic heterocyclic divalent group, a substituted or unsubstituted fused polycyclic aromatic divalent group, or a single bond, $Ar_{10}$ represents a substituted or unsubstituted aromatic hydrocarbon group, a substituted or unsubstituted aromatic heterocyclic group, or a substituted or unsubstituted fused polycyclic aromatic group, $R_{11}$ to $R_{14}$ are the same or different from each other, and represents a hydrogen atom, a deuterium atom, a fluorine atom, a chlorine atom, a cyano group, a nitro group, an optionally substituted linear or branched alkyl group having 1 to 6 carbon atoms, an optionally substituted cycloalkyl group having 5 to 10 atoms, an optionally substituted linear or branched alkenyl group having 2 to 6 atoms, an optionally substituted linear or branched alkyloxy group having 1 to 6 carbon atoms, an optionally substituted cycloalkyloxy group having 5 to 10 carbon atoms, a substituted or unsubstituted aromatic hydrocarbon group, a substituted or unsubstituted aromatic heterocyclic group, a substituted or unsubstituted fused polycyclic aromatic group, a substituted or unsubstituted aryloxy group, or a disubstituted amino group substituted with a group selected from the group consisting of an aromatic hydrocarbon group, an aromatic heterocyclic group, and a fused polycyclic aromatic group, or the groups of $R_{11}$ to $R_{14}$ form a ring with a single bond or are bonded to each other via a substituted or unsubstituted methylene group, an oxygen atom, or a sulfur atom to form a ring, or $R_{11}$ to $R_{14}$ and a benzene ring to which $R_{11}$ to $R_{14}$ are bonded, are bonded to each other via a linking group such as a substituted or unsubstituted methylene group, an oxygen atom, a sulfur atom, and a monoarylamino group to form a ring $R_{15}$ to $R_{18}$ are the same or different from each other, and represents a hydrogen atom, a deuterium atom, a fluorine atom, a chlorine atom, a cyano group, a nitro group, an optionally substituted linear or branched alkyl group having 1 to 6 carbon atoms, an optionally substituted cycloalkyl group having 5 to 10 atoms, an optionally substituted linear or branched alkenyl group having 2 to 6 atoms, an optionally substituted linear or branched alkyloxy group having 1 to 6 carbon atoms, an optionally substituted cycloalkyloxy group having 5 to 10 carbon atoms, a substituted or unsubstituted aromatic hydrocarbon group, a substituted or unsubstituted aromatic heterocyclic group, a substituted or unsubstituted fused polycyclic aromatic group, a substituted or unsubstituted aryloxy group, or a disubstituted amino group substituted with a group selected from the group consisting of an aromatic hydrocarbon group, an aromatic heterocyclic group, and a fused polycyclic aromatic group, the groups of $R_{15}$ to $R_{18}$ form a ring with a single bond or are bonded to each other via a substituted or unsubstituted methylene group, an oxygen atom, or a sulfur atom to form a ring, or $R_{15}$ to $R_{18}$ and a benzene ring to which $R_{15}$ to $R_{18}$ are bonded, are bonded to each other via a linking group such as a substituted or unsubstituted methylene group, an oxygen atom, a sulfur atom, and a monoarylamino group to form a ring, wherein the heterocyclic compound having a fused ring structure the heterocyclic compound having a fused ring structure represented by the general formula (2) is selected from a heterocyclic compound having a fused ring structure represented by the following general formula (2a), (2b), (2c), (2d), or (2e);

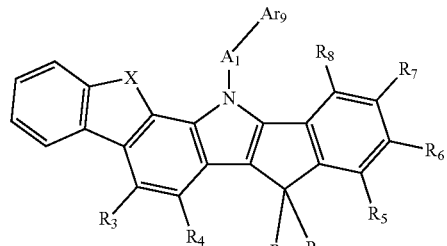
(2a)

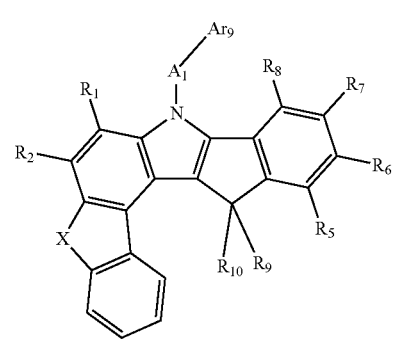
(2b)

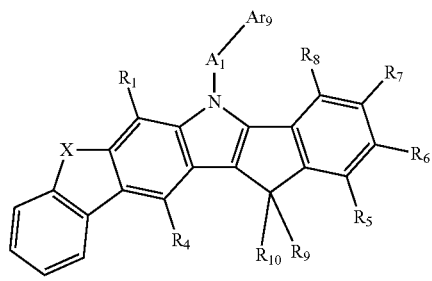
(2c)

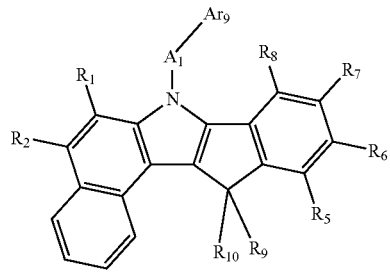
(2d)

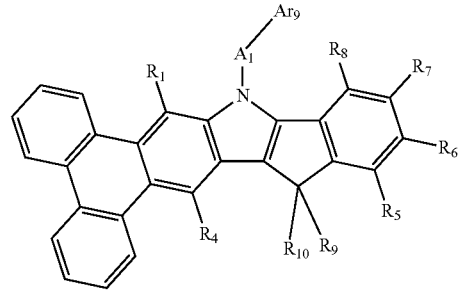
(2e)

wherein, in the formula (2a), (2b), (2c), (2d), or (2e), X represents a substituted or unsubstituted methylene group, an oxygen atom, a sulfur atom, or a monoarylamino group, $Ar_9$ and $R_1$ to $R_8$, $R_9$ and $R_{10}$ have the same meanings as shown in the general formula (2); and wherein the heterocyclic compound having a fused ring structure the heterocyclic compound having a fused ring structure represented by the general formula (3) is selected from a heterocyclic compound having a fused ring structure represented by the following general formula (3a-1), (3a-2), (3a-3), (3a-4), or (3b-1);

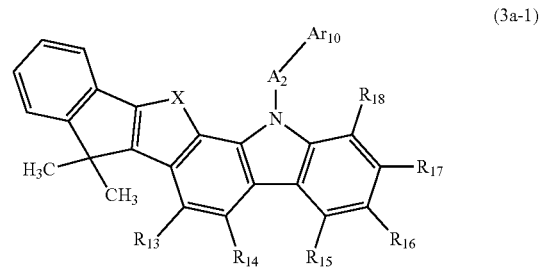
(3a-1)

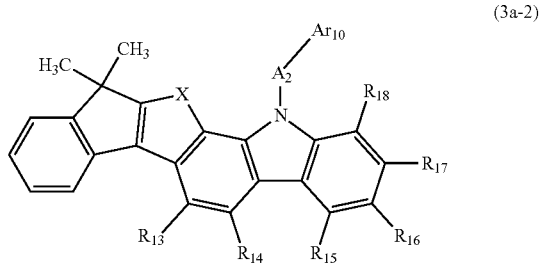
(3a-2)

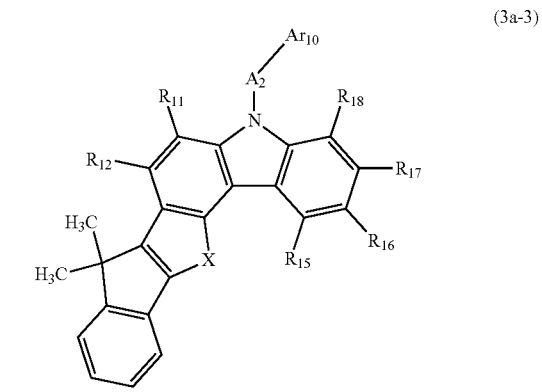
(3a-3)

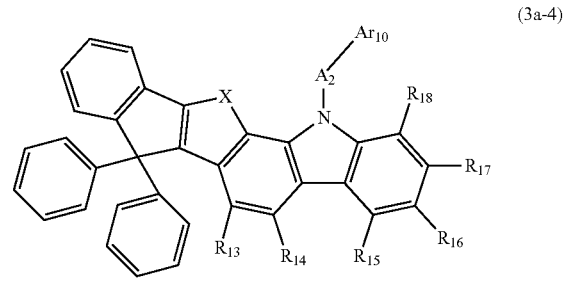
(3a-4)

-continued (3b-1)

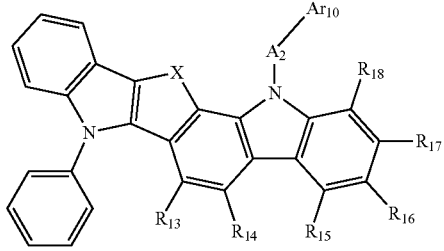

wherein, in the formula (3a-1), (3a-2), (3a-3), (3a-4), or (3b-1), X represents a substituted or unsubstituted methylene group, an oxygen atom, a sulfur atom, or a monoarylamino group, $Ar_{10}$ and $R_{11}$ to $R_{18}$ have the same meanings as shown in the general formula (3).

2. The organic electroluminescence device according to claim 1, wherein
the arylamine compound is represented by the following general formula (1a), (1a)

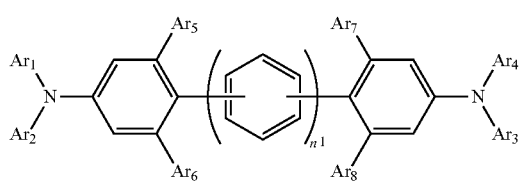

in the formula (1a), $Ar_1$ to $Ar_5$ are the same or different from each other, and represents a substituted or unsubstituted aromatic hydrocarbon group, a substituted or unsubstituted aromatic heterocyclic group, or a substituted or unsubstituted fused polycyclic aromatic group, $Ar_6$ to $Ar_8$ represents a hydrogen atom, n1 represents 0, 1, or 2, and in formula (1a), $Ar_3$ and $Ar_4$ form a ring with a single bond or are bonded to each other via a substituted or unsubstituted methylene group, an oxygen atom, or a sulfur atom to form a ring, or $Ar_3$ or $Ar_4$ may form a ring with a benzene ring to which an $Ar_3Ar_4$—N group is bonded, with a single bond or are bonded to each other via a substituted or unsubstituted methylene group, an oxygen atom, or a sulfur atom to form a ring.

3. The organic electroluminescence device according to claim 1, wherein
the electron transport layer contains a compound having a pyrimidine ring structure represented by the following general formula (4), (4)

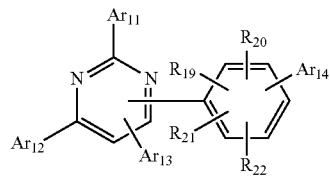

in the formula (4), $Ar_{11}$ represents a substituted or unsubstituted aromatic hydrocarbon group or a substituted or unsubstituted fused polycyclic aromatic group, $Ar_{12}$ and $Ar_{13}$ are the same or different from each other, and each represent a hydrogen atom, a substituted or unsubstituted aromatic hydrocarbon group, or a substituted or unsubstituted fused polycyclic aromatic group, $Ar_{14}$ represents a substituted or unsubstituted aromatic heterocyclic group, $R_{19}$ to $R_{22}$ are the same or different from each other, and each represent a hydrogen atom, a deuterium atom, a fluorine atom, a chlorine atom, a cyano group, a trifluoromethyl group, a linear or branched alkyl group having 1 to 6 carbon atoms, a substituted or unsubstituted aromatic hydrocarbon group, a substituted or unsubstituted aromatic heterocyclic group, or a substituted or unsubstituted fused polycyclic aromatic group, in formula (4), there is no case that both $Ar_{12}$ and $Ar_{13}$ are hydrogen atoms.

4. The organic electroluminescence device according to claim 1, wherein
the light-emitting layer contains a red light-emitting material.

5. The organic electroluminescence device according to claim 1, wherein
the light-emitting layer contains a phosphorescent light-emitting material.

6. The organic electroluminescence device according to claim 5, wherein
the phosphorescent light-emitting material is a metal complex containing iridium or platinum.

* * * * *